(12) United States Patent
Wang et al.

(10) Patent No.: US 11,655,557 B2
(45) Date of Patent: May 23, 2023

(54) METHODS AND DEVICES FOR GROWING CRYSTALS WITH HIGH UNIFORMITY WITHOUT ANNEALING

(71) Applicant: MEISHAN BOYA ADVANCED MATERIALS CO., LTD., Sichuan (CN)

(72) Inventors: Yu Wang, Meishan (CN); Weiming Guan, Meishan (CN); Zhenxing Liang, Meishan (CN); Min Li, Meishan (CN)

(73) Assignee: MEISHAN BOYA ADVANCED MATERIALS CO., LTD., Meishan (CN)

( * ) Notice: Subject to any disclaimer, the term of this patent is extended or adjusted under 35 U.S.C. 154(b) by 15 days.

(21) Appl. No.: 17/216,659

(22) Filed: Mar. 29, 2021

(65) Prior Publication Data

US 2021/0381122 A1 Dec. 9, 2021

Related U.S. Application Data

(63) Continuation of application No. PCT/CN2020/094684, filed on Jun. 5, 2020.

(51) Int. Cl.
*C30B 35/00* (2006.01)
*C30B 15/02* (2006.01)
(Continued)

(52) U.S. Cl.
CPC .............. *C30B 15/02* (2013.01); *C30B 15/10* (2013.01); *C30B 15/14* (2013.01); *C30B 15/22* (2013.01);
(Continued)

(58) Field of Classification Search
CPC ......... C30B 29/22; C30B 15/14; C30B 15/02; C30B 15/20; C30B 35/007; C30B 15/10; C30B 35/002
See application file for complete search history.

(56) References Cited

U.S. PATENT DOCUMENTS 5,116,456 A 5/1992 Nestor
2001/0001944 A1* 5/2001 Kitamura ................ C30B 15/00
117/200
(Continued)

FOREIGN PATENT DOCUMENTS

CN 101481821 A 7/2009
CN 102268731 A 12/2011
(Continued)

OTHER PUBLICATIONS

European Patent Office, computer translation of CN 104674344 (Year: 2022).*

(Continued)

*Primary Examiner* — Matthew J Song
(74) *Attorney, Agent, or Firm* — Metis IP LLC

(57) ABSTRACT

The present disclosure provides a method for crystal growth. The method may include at one of the following operations: weighing reactants for growing an oxide crystal after a first preprocessing operation is performed on the reactants; placing the reactants, on which a second preprocessing operation has been performed, into a crystal growth device after an assembly preprocessing operation is performed on at least one component of the crystal growth device, wherein the at least one component of the crystal growth device includes a crucible, the assembly preprocessing operation includes at least one of a coating operation, an acid soaking and cleaning operation, or an impurity cleaning operation; introducing a protective gas into the crystal growth device after sealing the crystal growth device; activating the crystal growth apparatus to execute the crystal growth; and adding reactant supplements into the crystal growth device in real-time during the crystal growth.

13 Claims, 10 Drawing Sheets

(51) Int. Cl.
*C30B 15/22* (2006.01)
*C30B 29/22* (2006.01)
*C30B 15/10* (2006.01)
*C30B 15/14* (2006.01)
*C30B 29/28* (2006.01)
*C30B 29/34* (2006.01)

(52) U.S. Cl.
CPC ............ *C30B 29/22* (2013.01); *C30B 29/28* (2013.01); *C30B 29/34* (2013.01)

(56) References Cited

U.S. PATENT DOCUMENTS

| | | | |
|---|---|---|---|
| 2012/0126171 | A1 | 5/2012 | Andreaco et al. |
| 2013/0306874 | A1 | 11/2013 | Yoshikawa et al. |
| 2014/0061537 | A1 | 3/2014 | Zagumennyi et al. |
| 2015/0090179 | A1 | 4/2015 | Schmid et al. |
| 2018/0251908 | A1* | 9/2018 | Hoshikawa ........... C30B 11/003 |
| 2021/0180210 | A1 | 6/2021 | Wang et al. |

FOREIGN PATENT DOCUMENTS

| | | | | |
|---|---|---|---|---|
| CN | 102877116 | A | | 1/2013 |
| CN | 102995108 | A | | 3/2013 |
| CN | 202945378 | U | | 5/2013 |
| CN | 103147119 | A | | 6/2013 |
| CN | 203393268 | U | | 1/2014 |
| CN | 104294353 | A | | 1/2015 |
| CN | 105543963 | A | | 5/2016 |
| CN | 106435712 | A | | 2/2017 |
| CN | 106757318 | A | | 5/2017 |
| CN | 107388823 | A | | 11/2017 |
| CN | 104674344 | B | * | 12/2017 ............ C30B 27/02 |
| CN | 108103568 | A | | 6/2018 |
| CN | 108330533 | A | | 7/2018 |
| CN | 208949444 | U | | 6/2019 |
| JP | 5601273 | B2 | | 10/2014 |

OTHER PUBLICATIONS

International Search Report in PCT/CN2020/094684 dated Mar. 3, 2021, 10 pages.
Written Opinion in PCT/CN2020/094684 dated Mar. 3, 2021, 12 pages.
The Extended European Search Report in European Application No. 20864333.8 dated Apr. 5, 2022, 9 pages.
Ren, Guohao et al., Investigation on Defects in Lu2SiO5: Ce Crystals Grown by Czochraiski Method, Crystal Research and Technology, 41(2): 163-167, 2006.
Pan, Yuxin et al., Growth and Optical Properties of Dy: Y3Ai5O12 Crystal, Physica B: Condensed Matter, 539(5): 317-321, 2018.
Pier Carlo Ricci et al., Ce3+-doped Lutetium Yttrium Orthosilicate Crystals: Structural Characterization, Materials Science and Engineering: B, 146(1-3): 2-6, 2008.
Hisashi Matsumura et al., Crystal Growth of Lutetium Oxyorthosilicate (LSO) by Melt-supply Double Crucible Czochraiski (DC-CZ) Method, Journal of Crystal Growth, 308(2): 348-351, 2007.
First Office Action in Chinese Application No. 202110381291.3 dated Aug. 20, 2021, 14 pages.
First Office Action in Chinese Application No. 202080004460.5 dated Sep. 1, 2021, 27 pages.
First Office Action in Chinese Application No. 202110309970.X dated Sep. 10, 2021, 17 pages.
Hua, Shuman, Study on Crystal Growth, Defects, Spectrum and Laser Properties of $Yb^{3}$+-Doped in Yag Crystal, Chinese Doctoral Dissertations & Master's Theses Full-text Database(Master) Information Science and Technology, 2005, 76 pages.
Nie, Ying, Research on Growth and Annealing Discoloration Mechanism of Yb: YAG Crystal by HDS Method, Chinese Doctoral Dissertations & Master's Theses Full-text Database(Master) Engineering Science and Technology I , 2014, 74 pages.

* cited by examiner

METHODS AND DEVICES FOR GROWING CRYSTALS WITH HIGH UNIFORMITY WITHOUT ANNEALING

CROSS-REFERENCE TO RELATED APPLICATIONS

This application is a continuation of International Patent Application No. PCT/CN2020/094684, filed on Jun. 5, 2020, the entire contents of which are hereby incorporated by reference.

TECHNICAL FIELD

The present disclosure relates to the field of crystal growth, and in particular, to methods and devices for growing oxide crystals with large size and high uniformity without annealing.

BACKGROUND

Scintillation crystal is used as an energy conversion medium that can convert ionizing radiation energy (e.g., a gamma ray, an X-ray) into light energy (e.g., visible light). The scintillation crystal is widely used in nuclear medicine field such as X-ray tomography (CT) and positron emission tomography (PET), nuclear detection field such as industrial tomography (industrial CT), oil well exploration field, nuclear physics field, high-energy physics field, environmental detection field, safety monitoring field, weapon fire control, and guidance field, etc. Especially in the high-energy physics field and the nuclear medicine field, the scintillation crystals are required to have relatively high light yield, relatively strong γ-ray absorption capacity, relatively short luminescence decay time, and relatively large radiation hardness, density, atomic number, etc. However, crystals that are grown under a traditional process condition have a relatively large head-tail concentration difference due to that a liquid level in a crucible continues to decrease as the crystals continue to grow, and since a segregation coefficient of solute is not equal to 1, a solute concentration of the melt in the crucible continuously increases or decreases, accordingly, a concentration of a grown crystal increases or decreases with the increase or decrease of the solute concentration of the melt, thereby affecting the quality or availability of the crystal. Therefore, it is needed to provide a method and device for growing oxide crystals of large size and high uniformity without annealing.

SUMMARY

The present disclosure discloses a method for growing oxide crystals with large size and high uniformity without annealing. According to the method, the crystal growth has a surprisingly excellent repeatability and the qualities of the crystals obtained in different growth processes are surprisingly consistent, which solves the problems that silicon dioxide is volatile, crystals are easy to crack and have component deviation during growth, a production cycle of the crystals is long, and crystals with uniform scintillation performance and no oxygen deficiency is difficult to be grown.

According to an aspect of the present disclosure, a method for growing a crystal is provided. The method may include weighing reactants for growing an oxide crystal after a first preprocessing operation is performed on the reactants and placing the reactants on which a second preprocessing operation has been performed into a crystal growth device after an assembly preprocessing operation is performed on at least one component of the crystal growth device. The at least one component of the crystal growth device may include a crucible. The assembly preprocessing operation may include a coating operation, an acid soaking and cleaning operation, and/or an impurity cleaning operation. The method may further include introducing a protective gas into the crystal growth device after sealing the crystal growth device; activating the crystal growth device to execute the crystal growth; and adding reactant supplements into the crystal growth device in real-time during the crystal growth.

According to another aspect of the present disclosure, a crystal growth device is provided. The crystal growth device may include a temperature field device. The temperature field device may include a bottom plate, a cover plate, a drum, and a filler. The bottom plate may be mounted on a bottom of the temperature field device and cover an open end of the drum. The cover plate may be mounted on a top of the temperature field device and cover the other open end of the drum. The filler may be filled inside the drum.

According to another aspect of the present disclosure, a crystal growth device is provided. The crystal growth device may include a temperature field device. The temperature field device may include a bottom plate, a cover plate, a first drum, a second drum, and a filler. The bottom plate may be mounted on a bottom of the temperature field device and cover an open end of the first drum. The cover plate may be mounted on a top of the temperature field device and cover the other open end of the first drum. The second drum may be mounted inside the first drum. The filler may be filled in the second drum and/or a space between the second drum and the first drum.

According to another aspect of the present disclosure, a crystal is provided. A formula of the crystal may be

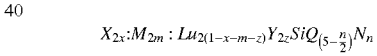

or $X_{(1-z)}Z_zVO_4$. X may consist of Ca, Mg, Sr, Mn, Ba, Al, Fe, Re, La, Ce, Rr, Nd, Pm, Sm, Eu, Gd, Td, Dy, HO, Er, Yb, Tm, Lu, and/or Sc, Y may consist of B, Li, Ga, Gd, Ce, Y, Yb, Er, Sc, Mg, Ca, and/or Tb, M may consist of Ce, Cl, F, Br, N, P, and/or S. Z may consist of Li, B, Gd, Mg, Ca, Tb, Y, Lu, La, Yb, Sc, Er, and/or Ga. Q may consist of O, Cl, F, Br, and/or S. N may consist of Cl, F, Br, and/or S. A may consist of Al, Ga, In, and/or Sc. B may consist of Al. x=0-0.06, y=0-1, b=0-1, m=0.000001-0.06, Z=0-1, n=0-5.

According to another aspect of the present disclosure, a crystal is provided. A formula of the crystal may be $(X_{1-y}Y_y)_3(A_{1-b}B_b)_5O_{12}$. X may consist of Gd, Lu, Y, La, and/or Yb. Y may consist of B, Li, Ga, Gd, Ce, Y, Yb, and/or Er. A may consist of Al, Ga, In, and/or Sc. B may consist of Al. x=0-1, y=0-1, b=0-1.

BRIEF DESCRIPTION OF THE DRAWINGS

The present disclosure is further illustrated in terms of exemplary embodiments. These exemplary embodiments are described in detail with reference to the drawings. These embodiments are non-limiting exemplary embodiments, in which like reference numerals represent similar structures, and wherein.

DETAILED DESCRIPTION

Figure 1:
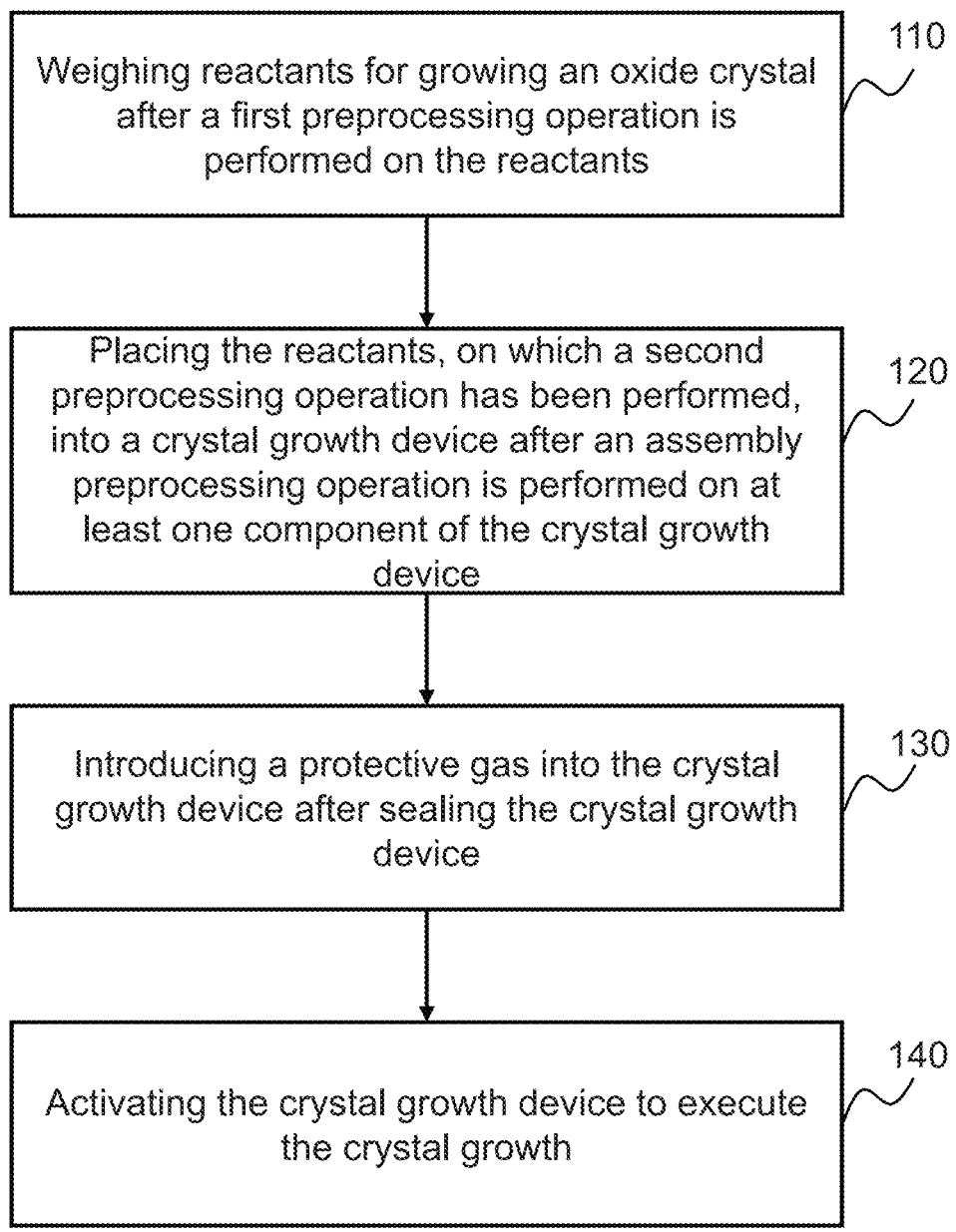
FIG. 1 is a flowchart illustrating an exemplary process for growing a crystal according to some embodiments of the present disclosure.

In the following detailed description, numerous specific details with reference to the accompanying drawings are set forth by way of examples in order to provide a thorough understanding of the relevant disclosure. Various modifications to the disclosed embodiments will be readily apparent to those skilled in the art, and the general principles defined herein may be applied to other embodiments and applications without departing from the spirit and scope of the present disclosure. The identical numerals in the drawings represent same or similar structures or operations, unless the context dearly indicates otherwise.

It will be understood that the term "system," "device," "unit," and/or "module," used herein are one method to distinguish different components, elements, parts, sections or assembly of different levels in ascending order. However, the terms may be displaced by another expression if they achieve the same purpose.

The terminology used herein is for the purpose of describing particular example embodiments only and is not intended to be limiting. As used herein, the singular forms "a," "an," and "the" may be intended to include the plural forms as well, unless the context dearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

The range of values used herein in the present disclosure briefly illustrates each value in the range of values.

The flowcharts used in the present disclosure illustrate operations that systems implement according to some embodiments of the present disclosure. It should be noted that the foregoing or the following operations may not be performed in the order accurately. Instead, the steps can be processed in reverse order or simultaneously. Besides, one or more other operations may be added to the flow charts, or one or more operations may be omitted from the flow chart.

FIG. 1 is a flowchart illustrating an exemplary process for growing a crystal according to some embodiments of the present disclosure.

In 110, reactants for growing an oxide crystal may be weighed after a first preprocessing operation is performed on the reactants. In some embodiments, the oxide crystal may include gadolinium aluminum gallium garnet (GAGE), yttrium aluminum garnet (YAG), lutetium oxyorthosilicate (LSO), lutetium yttrium oxyorthosilicate (LYSO), gadolinium yttrium oxyorthosilicate (GYSO), terbium gallium garnet (TGG), gadolinium gallium garnet (GGG), yttrium vanadate (YVO4), gadolinium oxyorthosilicate (GSO), sapphire, etc., and respective doped crystals (e.g., cerium doped crystals) thereof. In some embodiments, the oxide crystal may include a crystal represented by a formula below:

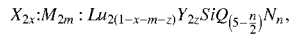

$X_{(1-z)}Z_zVO_4$, or $(X_{1-y}Y_y)_3(A_{1-b}B_b)_5O_{12}$. X may consist of at least one of Ca, Mg, Sr, Mn, Ba, Al, Fe, Re, La, Ce, Rr, Nd, Pm, Sm, Eu, Gd, Td. Dy, HO, Er, Yb, Tm, Lu, or Sc, Y may consist of at least one of B, Li, Ga, Gd, Ce, Y, Yb, Er, Sc, Mg, Ca, or Tb. M may consist of at least one of Ce, Cl, F, Br, N, P, or S. Z may consist of at least one of Li, B, Gd, Mg, Ca, Tb, Y, Lu, La, Yb, Sc, Er, or Ga. Q may consist of at least one of O, Cl, F, Br, or S. N may consist of at least one of Cl, F, Br, or S. A may consist of at least one of Al, Ga, In, or Sc, B may consist of Al. A value of x may be any value in 0-0.06. A value of y may be any value in 0-1. A value of b may be any value in 0-1. A value of in may be any value in 0.000001-0.06. A value of Z may be any value in 0-1. A value of n may be any value in 0-5.

In some embodiments, the reactants used to grow the oxide crystal may be determined according to a reaction equation for growing the oxide crystal. The reactants may be weighed according to a molar ratio of the reactants according to the reaction equation. In some embodiments, Y may at least consist of Ce. A reactant containing Ce may include at least one of $CeO_2$, $Ce_2O_3$, $Ce(CO_3)_2$, $CeCl_3$, cerium fluoride, cerium sulfide, cerium bromide, or other cerium compounds. It can be understood that when the oxide crystal is grown, all reactants are in a high temperature environment. One or more reactants may volatilize due to the high temperature environment, which may cause a ratio among initial reactants to be out of balance. As a result, the composition of the grown crystal may deviate, the compositions of the crystals obtained by multiple growth processes may be different, and the repeatability of the crystal growth may be poor. Therefore, when the reactants are weighed, the reactant(s) that is/are easy to volatile in a high temperature environment may be excessive during the weighing. In some embodiments, when the oxide crystal is $X_{2(1-x)}Y_{2x}SiO_5$ or $X_{2(1-x-y)}Z_{2y}Y_{2x}SiO_5$, the reactant containing Si may be relatively easy to volatile in the high temperature environment. Therefore, the reactant containing Si for growing the oxide crystal may exceed 0.01%-10% of its own weight. The reactant containing Si for growing the oxide crystal may exceed 0.01%-10% of a theoretical weight value of the reactant containing Si. More preferably, the reactant containing Si for growing the oxide crystal may exceed 0.1%-10% of its own weight. More preferably, the reactant containing Si for growing the oxide crystal may exceed 0.11%-10% of its own weight. More preferably, the reactant containing Si for growing the oxide crystal may exceed 0.12%-9% of its own weight. More preferably, the reactant containing Si for growing the oxide crystal may exceed 0.13%-8% of its own weight. More preferably, the reactant containing Si for growing the oxide crystal may exceed 0.14%-7% of its own weight. More preferably, the reactant containing Si for growing the oxide crystal may exceed 0.15%-6% of its own weight, More preferably, the reactant containing Si for growing the oxide crystal may exceed 0.16%-5% of its own weight. More preferably, the reactant containing Si for growing the oxide crystal may exceed 0.17%-4% of its own weight. More preferably, the reactant containing Si for growing the oxide crystal may exceed 0.18%-3% of its own weight. More preferably, the reactant containing Si for growing the oxide crystal may exceed 0.2%-2% of its own weight. In particular, when x=0.16%, the reactant containing Si for growing the oxide crystal may exceed 0.2% of its own weight. When x=0.16% and y=20%, the reactant containing Si for growing the oxide crystal may exceed 2% of its own weight. In some embodiments, when the oxide crystal is $(X_{1-y}Y_y)_3(A_{1-b}B_b)_5O_{12}$, the reactant containing Y may be relatively easy to volatile in the high temperature environment. Therefore, the reactant containing Y for growing the oxide crystal may exceed 0.01%-10% of its own weight, More preferably, the reactant containing Y for growing the oxide crystal may exceed 0.1%-10% of its own weight. More preferably, the reactant containing Y for growing the oxide crystal may exceed 1%-10% of its own weight. More preferably, the reactant containing Y for growing the oxide crystal may exceed 2%-9% of its own weight. More preferably, the reactant containing Y for growing the oxide crystal may exceed 3%-8% of its own weight. More preferably, the reactant containing Y for growing the oxide crystal may exceed 4%-7% of its own weight. More preferably, the reactant containing Y for growing the oxide crystal may exceed 5%-6% of its own weight. In particular, when b=0.1 or 0.2 and y=0.003, the reactant containing Y for growing the oxide crystal may exceed 2% of its own weight.

In some embodiments, the first preprocessing operation may include high-temperature roasting. It can be understood that in order to remove other substances contained in the reactants, such as water and other organic substances of metal elements (including cerium, gallium, aluminum, gadolinium, etc.) as many as possible to make the reactants purer, all the reactants may be roasted to achieve the purpose of removing the water and the other organic substances. Commercially available high-temperature roasting device such as a muffle furnace may be used to roast the reactants. In some embodiments, a roasting temperature of the reactants may be 800° C.-1400° C. Preferably, the roasting temperature of the reactants may be 900° C.-1300° C. More preferably, the roasting temperature of the reactants may be 1000° C.-1200° C. More preferably, the roasting temperature of the reactants may be 1050° C.-1150° C. More preferably, the roasting temperature of the reactants may be 1060° C.-1140° C. More preferably, the roasting temperature of the reactants may be 1070° C.-1130° C. More preferably, the roasting temperature of the reactants may be 1080° C.-1120° C. More preferably, the roasting temperature of the reactants may be 1090° C.-1110° C. According to characteristics of the different reactants, the time of the high-temperature roasting may not be less than 5 hours.

Taking a growth of cerium-doped LSO or cerium-doped LYSO as an example, the reaction equation may be denoted by Equations below:

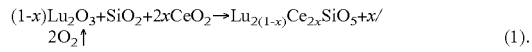
(1).

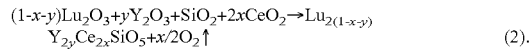
(2).

As shown in the reaction equation (2), it can be understood that trivalent cerium ions replace part of lutetium atoms to form the final crystal structure of the Ce:LYSO to be grown. In the above reaction equations, x refers to a doping concentration of trivalent cerium ion ($Ce^{3+}$), that is, a proportion of $Ce^{3+}$ occupying crystal lattice of lutetium atomic (Lu). y refers to a proportion of yttrium (Y) atoms in the crystal lattice of the Ce:LYSO. In some embodiments, a value of x may be any value in 0.0001%-6%. More preferably, the value of x may be any value in 0.001%-5%. More preferably, the value of x may be any value in 0.01%-4%. More preferably, the value of x may be any value in 0.1%-3%. More preferably, the value of x may be any value in 0.11%-2%. More preferably, the value of x may be any value in 0.12%-1%. More preferably, the value of x may be any value in 1.13%-0.5%. More preferably, the value of x may be any value in 0.14%-0.25%. More preferably, the value of x may be any value in 0.15%-0.17%. More preferably, the value of x may be 0.16%. A value of y may be any value in 0-100%. More preferably, the value of y may be any value in 3%-90%. More preferably, the value of y may be any value in 5%-80%. More preferably, the value of y may be any value in 7%-70%. More preferably, the value of y may be any value in 10%-60%. More preferably, the value of y may be any value in 13%-50%. More preferably, the value of y may be any value in 15%-40%. More preferably, the value of y may be any value in 17%-30%. More preferably, the value of y may be any value in 18%-22%. More preferably, the value of y may be any value in 19%-21%. More preferably, the value of y may be 20%. It should be noted that when the Ce:LSO is grown, a value of x is similar to the above description. For example, the value of x may be any value in 0.0001%-6%, or other preferred value ranges listed.

It can be understood that during the growth of the crystal, silicon dioxide ($SiO_2$) is easy to volatile under a heating condition, Therefore, an excessive amount of silicon dioxide reactant may be added during the process of the crystal growth to solve the problems of the component deviation and the poor repeatability caused by the volatilization of the reactants to a certain extent. In some embodiments, a weight of the silicon dioxide may exceed 0.01%-10% of its theoretical weight or a total weight of the reactants determined according to the above reaction equation(s). Preferably, the weight of the silicon dioxide may exceed 0.1%-10% of its theoretical weight or the total weight of the reactants. More preferably, the weight of the silicon dioxide may exceed 0.11%-10% of its theoretical weight or the total weight of the reactants. More preferably, the weight of the silicon dioxide may exceed 0.12%-9% of its theoretical weight or the total weight of the reactants. More preferably, the weight of the silicon dioxide may exceed 0.13%-8% of its theoretical weight or the total weight of the reactants. More preferably, the weight of the silicon dioxide may exceed 0.14%-7% of its theoretical weight or the total weight of the reactants. More preferably, the weight of the silicon dioxide may exceed 0.15%-6% of its theoretical weight or the total weight of the reactants. More preferably, the weight of the silicon dioxide may exceed 0.16%-5% of its theoretical weight or the total weight of the reactants. More preferably, the weight of the silicon dioxide may exceed 0.17%-4% of its theoretical weight or the total weight of the reactants. More preferably, the weight of the silicon dioxide may exceed 0.18%-3% of its theoretical weight or the total weight of the reactants. More preferably, the weight of the silicon dioxide may exceed 0.2%-2% of its theoretical weight or the total weight of the reactants. In some embodiments, when x=0.16%, the weight of the silicon dioxide may exceed 0.2% of its theoretical weight or the total weight of the reactants. When x=0.16% and y=20%, the weight of the silicon dioxide may exceed 2% of its theoretical weight or the total weight of the reactants.

Purity of the reactants may have a great influence on the scintillation performance of the crystal. Therefore, in order to make the grown crystal meet the requirements, the purity of the reactants for growing the crystal may be greater than 99%. Preferably, the purity of the reactants may be greater than 99.9%. More preferably, the purity of the reactants may be greater than 99.99%. More preferably, the purity of the reactants may be greater than 99.999%.

In 120, the reactants, on which a second preprocessing operation has been performed, may be placed into a crystal growth device after an assembly preprocessing operation is performed on at least one component of the crystal growth device. In some embodiments, the at least one component of the crystal growth device may include a crucible. In some embodiments, the crucible may be a single crucible. In some embodiments, the crucible may include a plurality of crucibles of different materials. The crucible may at least include an outer crucible and an inner crucible. For example, outer surfaces of the outer crucible and the inner crucible may be coated, and then the inner crucible may be sheathed in the outer crucible using a mold to form the crucible. Exemplary coating may include a high-temperature resistant coating such as a zirconia coating, a nano ceramic coating, a ZS (zhengsheng)-1023 ultra-high temperature metal anti-oxidation coating, and a CY-CM refractory and thermal insulation coating, etc. In some embodiments, the assembly preprocessing operation may include at least one of a coating operation, an acid soaking and cleaning operation, or an impurity cleaning operation. In some embodiments, the crucible may be made of iridium (Ir), molybdenum (Mo), tungsten (W), rhenium (Re), graphite (C), tungsten-molybdenum alloy, etc. In some embodiments, the inner crucible and/or the outer crucible may be made of a conductor such as the iridium (Ir), the molybdenum (Mo), the tungsten (W), the rhenium (Re), the graphite (C), the tungsten-molybdenum alloy, etc. The coating operation may refer to an operation in which a high-temperature coating material (e.g., polyamide silicone) is added to the entire outer surface of the crucible. According to the coating operation, a contact between oxygen and the surface of the crucible can be isolated or reduced, accordingly, the oxidation of the crucible and the influence of oxides on the crystal can be avoided or reduced under a high-temperature and oxygen-rich environment. In some embodiments, after the coating operation is performed, an acid soaking and cleaning operation may be also performed on the crucible. For example, an inner wall of the crucible may be soaked using acid. In some embodiments, the acid may include an organic acid and/or an inorganic acid. Exemplary organic acid may include carboxylic acid (e.g., formic acid, acetic acid, oxalic acid), sulfonic acid (e.g., ethanesulfonic acid, benzenesulfonic acid), sulfinic acid, or the like, or any combination thereof. Exemplary inorganic acid may include hydrochloric acid, sulfuric acid, nitric acid, phosphoric acid, hydrofluoric acid, or the like, or any combination thereof. In some embodiments, a concentration of the acid may be 1%-15%. Preferably, the concentration of the acid may be 3%-13%. More preferably, the concentration of the acid may be 5%-11%. More preferably, the concentration of the acid may be 6%-10%. More preferably, the concentration of the acid may be 7%-9%. More preferably, the concentration of the acid may be 7.5%-8.5%. A soaking time of the acid may be 0.1-10 hours. Preferably, the soaking time of the acid may be 0.5-7 hours. More preferably, the soaking time of the acid may be 0.6-5 hours. More preferably, the soaking time of the acid may be 0.8-4 hours. More preferably, the soaking time of the acid may be 1-3 hours. More preferably, the soaking time of the acid may be 1.5-2.5 hours. After the soaking is performed, the crucible may be cleaned with pure water and dried. The impurity cleaning operation may refer to a process for removing the impurity in the crucible. The crucible may be wiped with medical alcohol. After the assembly preprocessing operation is performed, the crucible may be mounted.

In some embodiments, the second preprocessing operation may include at least one of a reactant mixing operation or a pressing operation at room temperature. It can be understood that uniformly mixed reactants may be conducive to the subsequent growth of the crystal. A mixing device may include a three-dimensional motion mixer, a double cone mixer, a vacuum mixer, a coulter mixer, a V-type mixer, a conical twin-screw mixer, a planetary mixer, a horizontal screw mixer, etc. A mixing time of the reactants may be 0.5-48 hours, Preferably, the mixing time may be 1-48 hours, More preferably, the mixing time may be 6-42 hours. More preferably, the mixing time may be 12-36 hours. More preferably, the mixing time may be 18-30 hours. More preferably, the mixing time may be 21-27 hours.

The pressing operation may refer to an operation in which a certain pressure may be applied to the reactants to transform the reactants from a dispersed form into a body with an initial shape, for example, a cylindrical shape. The pressed reactants may have a volume smaller than that of the reactants in the dispersed state, and is easier to be put into a reaction place, for example, a reaction crucible in one time. Meanwhile, the pressing operation may discharge the air contained in the reactants in the dispersed state to reduce an impact of the air on the crystal growth in subsequent reactions. The pressing operation may be performed by an isostatic pressing device such as a cold isostatic pressing device. The reactants may be placed in a pressing tank and pressed into a shape. A pressure used during the pressing operation may be 100-300 MPa. Preferably, the pressure used during the pressing operation may be 150-250 MPa. More preferably, the pressure used during the pressing operation may be 160-240 MPa. More preferably, the pressure used during the pressing operation may be 170-230 MPa. More preferably, the pressure used during the pressing operation may be 180-220 MPa. More preferably, the pressure used during the pressing operation may be 190-210 MPa. More preferably, the pressure used during the pressing operation may be 200 MPa.

In some embodiments, the crystal growth device may include a single crystal growth furnace and a temperature field device. A type of the single crystal growth furnace may be an open type or a vacuum type, which is not limited in the present disclosure. The temperature field device may be used in a single crystal growth furnace to provide a temperature gradient for the crystal growth, and ensure the stability of a crystallization process of the crystal. A temperature field with good symmetry and stability may avoid problems of cracking and abnormal growth during the crystal growth. The temperature field device may include a first hollow column and two cover plates covering two ends of the first hollow column, respectively. Specifically, the two cover plates may be connected to the two ends of the first hollow column. The connection may include a bonding connection, a welding connection, a riveting connection, a key sheath connection, a bolting connection, a buckle connection, etc. Alternatively, one end of the first hollow column may be connected to one cover plate (e.g., via a detachable connection), and the other end of the first hollow column may be integrally formed with other cover plate, or connected to the other cover plate via a non-detachable connection. A second hollow column with a height smaller than that of the first hollow column may be mounted inside the first hollow column. A space between the first hollow column and the second hollow column and/or a space in the second hollow column may be filled with a substance used for heat preservation. For example, the space between the first hollow column and the second hollow column and the space in the second hollow column may be filled with substances for heat preservation. As another example, the space between the first hollow column and the second hollow column may be filled with substances for heat preservation, and the space in the second hollow column may not be filled. As a further example, the space between the first hollow column and the second hollow column may not be filled with substances for heat preservation, and the space in the second hollow column may be filled with substances for heat preservation. The substances filled in the second hollow column may also be configured to support a crucible for holding the reactants. A heater may be mounted above the crucible, which may be configured to reduce the temperature gradient above the open of the crucible. The crystal growth device may also include a feeding component configured to feed reactant supplements into the crucible during the crystal growth. In addition, an end of the second hollow column near the cover plate mounted on a top of the first hollow column may be connected with a heat preservation board to further improve the thermal preservation effect. In this case, the temperature field device described in the present disclosure may provide a reaction environment with good heat preservation performance, stable temperature field gradient, and good symmetry due to the hollow columns and the substance used for heat preservation, which may be beneficial to the crystal growth. More descriptions regarding the temperature field device may be found elsewhere in the present disclosure (e.g., FIGS. 2-5), which are not repeated here.

In 130, a flowing gas may be introduced into the crystal growth device after the crystal growth device is sealed. In some embodiments, the sealing of the crystal device may refer to that except for necessary contact, there is no gas exchange between the crystal growth device and the atmosphere environment. For example, a hearth of an open single crystal growth furnace may be opened and an operator (e.g., a worker) may directly observe the temperature field device in the open single crystal growth furnace, whereas, the temperature field device is sealed and have no gas exchange with the atmospheric environment. As another example, an interior of a vacuum single crystal growth furnace may be vacuum, and the crystal growth device may have no gas exchange with the atmospheric environment. To realize the seal of the crystal growth device, a sealing ring, vacuum grease, or other sealing material may be mounted at the joints among various components of the crystal growth device. It can be understood that a suitable protective gas may reduce volatilization of a reactant (e.g., silicon oxide) to a certain extent, thereby solving a problem of component deviation of the crystal during the crystal growth. In some embodiments, a protective gas may be introduced into the crystal growth device (e.g., the temperature field device) after the crystal growth device is sealed. The protective gas may include a flowing gas or a non-flowing gas. The flowing gas may refer to a protective gas that enters from an inlet of the crystal growth device and exits from an outlet of the crystal growth device. The non-flowing gas may refer to an inert gas that continues to exist after being introduced into the crystal growth device and forms an inert gas environment. In some embodiments, the flowing gas may include oxygen, nitrogen, or inert gas. In some embodiments, the flowing gas may include a mixed gas of oxygen and one or more of hydrogen, carbon dioxide, carbon monoxide, nitrogen, and inert gas. In some embodiments, in an early stage of the crystal growth, for example, before the crystal growth is cooled down, when the flowing gas includes a mixed gas oxygen and one or more of hydrogen, carbon dioxide, carbon monoxide, nitrogen, and inert gas, a volume ratio of oxygen may be 0.001%-20%, 0.001%-15%, 0.001%-13%, 0.001%-12%, or 0.001%-10%. Preferably, the volume ratio of oxygen may be 0.01%-10%. More preferably, the volume ratio of oxygen may be 0.1%-10%, More preferably, the volume ratio of oxygen may be 1%-10%, 4%-15%, 5%-12%, 7%-12%, 8%-11%, 9%-11%, or 10%, More preferably, the volume ratio of oxygen may be 2%-9%. More preferably, the volume ratio of oxygen may be 3%-8%. More preferably, the volume ratio of oxygen may be 4%-7%. More preferably, the volume ratio of oxygen may be 5%-6%, To ensure that the flowing gas does not affect the reactants, for example, to bring in an impurity, the purity of the flowing gas may be greater than 99%. Preferably, the purity of the flowing gas may be greater than 99.9%. More preferably, the purity of the flowing gas may be greater than 99.99%. More preferably, the purity of the flowing gas may be greater than 99.999%. When introducing the flowing gas to the crystal growth device, a flow rate of the flowing gas may be 0.01-50 L/min. Preferably, the flow rate of the flowing gas may be 0.1-50 L/min. More preferably, the flow rate of the flowing gas may be 1-50 L/min, More preferably, the flow rate of the flowing gas may be 5-45 L/min, More preferably, the flow rate of the flowing gas may be 10-40 L/min. More preferably, the flow rate of the flowing gas may be 15-35 L/min. More preferably, the flow rate of the flowing gas may be 20-30 L/min. More preferably, the flow rate of the flowing gas may be 21-29 L/min, More preferably, the flow rate of the flowing gas may be 22-28 L/min. More preferably, the flow rate of the flowing gas may be 23-27 L/min. More preferably, the flow rate of the flowing gas may be 24-26 L/min. In some embodiments, the non-flowing gas may include oxygen, nitrogen, or inert gas. In some embodiments, the non-flowing gas may include a mixed gas of oxygen and one or more of hydrogen, carbon dioxide, carbon monoxide, nitrogen, and inert gas. When the non-flowing gas is introduced into the crystal growth device, a pressure inside the crystal growth device may be −0.05-0.08 Mpa.

In 140, the crystal growth device may be activated to grow the crystal. In some embodiments, the activation of the crystal growth device may include energizing and/or activating a cooling component. The reactants may be used for the crystal growth after being melted by heating. After being energized, an intermediate frequency induction coil mounted in the single crystal growth furnace may heat the crucible to melt the reactants in the crucible. In some embodiments, a melting time of the reactants may be 5-48 hours. Preferably, the melting time of the reactants may be 10-40 hours or 30 hours. More preferably, the melting time of the reactants may be 15-35 hours. More preferably, the heating time to melt the reactants may be 20-30 hours. More preferably, the melting time of the reactants may be 22-28 hours, More preferably, the melting time of the reactants may be 23-27 hours. More preferably, the melting time of the reactants may be 24-26 hours. More preferably, the melting time of the reactants may be 24.5-25.5 hours. It should be understood that since a high temperature (e.g., 1900° C.) is required during the crystal growth, a plenty of heat radiation may be generated to the external environment. Further, since the crystal growth time (e.g., 4-40 days) is relatively long, the long-term high-temperature radiation may affect the performance of the crystal growth device. Accordingly, the cooling component may be used to reduce the heat radiation. A cooling manner of the cooling component may include liquid cooling, wind cooling, air cooling, or other cooling manners. For the liquid cooling, a cooling liquid may include water, ethanol, ethylene glycol, isopropanol, n-hexane, or the like, or any combination thereof. For example, the cooling liquid may include a 50:50 mixture of water and ethanol.

In some embodiments, a technique for growing the crystal may include a Czochralski technique, a Bridgman technique, etc. The Czochralski technique may be taken as an example to illustrate the crystal growth. The Czochralski technique may include a melting process, a seed crystal preheating process, a seeding process, a temperature adjustment process, a necking process, a shouldering process, a constant diameter growth process, an ending process, a cooling process, a crystal removing process, etc. The melting process may refer to a process during which the temperature may be increased to a certain value via a temperature increasing process, the reactants may be melted to form a melt, and a certain temperature (i.e., temperature gradient) can be kept in the crystal growth device. The crucible in the crystal growth device may be used as a heater and heat may be radiated from the crucible to the surroundings to form the temperature gradient in the crystal growth device. The temperature gradient may refer to a change rate of the temperature at a certain point toward a temperature of an adjacent point in the crystal growth device, which may also be referred to as a change rate of the temperature per unit distance. For example, a temperature change from a point M to a point N is $(T_1-T_2)$, and a distance between the point M and the point N is $(r_1-r_2)$, the temperature gradient from the point M to the point N may be $\Delta T=(T_1-T_2)/(r_1-r_2)$. During the crystal growth, a suitable temperature gradient is needed. For example, during the crystal growth, a large enough temperature gradient $\Delta T$ along a vertical direction is needed, which can disperse the latent heat of crystallization generated during the crystal growth, thereby keeping the crystal growth stable. Meanwhile, a temperature of the melt below a growth interface should be higher than a crystallization temperature, so that the local growth of crystal would not be too fast and the growth interface would be stable, thereby keeping the growth stable. The temperature gradient may be determined based on a location of a heating center. The heating center of the melting process may affect the determination of the temperature gradient. In some embodiments, during the melting process, the reactants may be melted and then solidified to form a polycrystalline material, when a diameter of the polycrystalline material reaches 40 mm, the temperature increasing operation may be stopped. An upper limit of the temperature increasing operation may be determined according to a temperature or a heating power (e.g., a power of the induction coil) at a time when a screw rod started to be pulled up when the crystal growth device was used at the last time. For example, the heating power may be less than the heating power at the time when the pulling rod started to be pulled up at the last time by 300-500 watts. A temperature increasing rate may be determined based on the temperature at which the pulling started to be pulled up at the last time. For example, the temperature increasing rate may be a ratio of the temperature and the time (e.g., 24 hours). After temperature increasing operation is completed, the temperature may be maintained for 0.5-1 hour, According to a melting condition of the reactants, the temperature may be continually increased or decreased.

The seed crystal preheating process may refer to a process in which the seed crystal may be fixed on a top of the pulling rod and slowly dropped into the temperature field during the melting process, which can make a temperature of the seed crystal close to that of the melt, thereby avoiding cracking of the seed crystal when a supercooled seed crystal contacts with the melt in subsequent operations. During the seed crystal preheating process, a distance between the seed crystal and an upper surface of the reactants may be kept at 5-100 mm. Preferably, the distance between the seed crystal and the upper surface of the reactants may be kept at 6-9 mm. More preferably, the distance between the seed crystal and the upper surface of the reactants may be kept at 7-8 mm. More preferably, the distance between the seed crystal and the upper surface of the reactants may be kept at 7.2-7.8 mm, More preferably, the distance between the seed crystal and the upper surface of the reactants may be kept at 7.4-7.6 mm. During the seed crystal preheating process, a dropping speed of the seed crystal may be 50-800 mm/hour. Preferably, the dropping speed of the seed crystal may be 100-700 mm/hour. More preferably, the dropping speed of the seed crystal may be 200-600 mm/hour. More preferably, the dropping speed of the seed crystal may be 300-500 mm/hour. More preferably, the dropping speed of the seed crystal may be 350-450 mm/hour. More preferably, the dropping speed of the seed crystal may be 370-430 mm/hour. More preferably, the dropping speed of the seed crystal may be 390-410 mm/hour. More preferably, the dropping speed of the seed crystal may be 5-100 mm/hour.

The seeding process may refer to a process in which the pulling rod may be dropped to cause the seed crystal to contact with the melt after the reactants are completely melted or a diameter of the reactants which have not been melted is less than a predetermined value. The temperature adjustment process may refer to a process in which a temperature in the crystal growth device may be adjusted to a suitable temperature for the crystal growth. During the temperature adjustment process, the seed crystal may be sunk by 0.1-50 mm. Preferably, the seed crystal may be sunk by 1-50 mm, More preferably, the seed crystal may be sunk by 10-40 mm. More preferably, the seed crystal may be sunk by 20-30 mm. More preferably, the seed crystal may be sunk by 21-29 mm. More preferably, the seed crystal may be sunk by 22-28 mm. More preferably, the seed crystal may be sunk by 23-27 mm. More preferably, the seed crystal may be sunk by 24-26 mm. In some embodiments, a rate of temperature adjustment may be 100-300 watts/0.1 hour. After the temperature adjustment process is completed, the temperature inside the crystal growth device may be kept at 1900-2200° C. for 0.1-1 hour. Then, the screw rod may be rotated to pull the pulling rod up. After the seed crystal passes through a second cover plate and during the subsequent crystal growth process, a rotation speed of the pulling rod may be 0.01-35 revolutions per minute. Preferably, the rotation speed of the pulling rod may be 0.1-35 revolutions per minute. More preferably, the rotation speed of the pulling rod may be 1-35 revolutions per minute, More preferably, the rotation speed of the puffing rod may be 5-30 revolutions per minute. More preferably, the rotation speed of the pulling rod may be 10-25 revolutions per minute. More preferably, the rotation speed of the pulling rod may be 15-20 revolutions per minute.

The necking process may refer to a process in which the temperature may be slowly increased to cause a temperature of a zero point of the melt (i.e., a temperature of a center point of the liquid surface in the crucible) to be slightly higher than the melting point of the crystal, a diameter of a newly grown crystal during the rotation and pulling up of the seed crystal may be gradually decreased. The necking process may reduce the extension of crystal dislocations from the seed crystal to a single crystal below a neck. The shouldering process may refer to a process in which when atoms or molecules on a solid-liquid interface at a boundary between the seed crystal and the melt begin to be arranged in a structure of the seed crystal, the temperature in the temperature field may be slowly decreased according to a real-time growth rate of the crystal to expand the seed crystal according to a preset angle. In some embodiments, a shouldering angle may be 30-70 degrees. Preferably, the shouldering angle may be 40-60 degrees. More preferably, the shouldering angle may be 45-55 degrees. More preferably, the shouldering angle may be 46-54 degrees. More preferably, the shouldering angle may be 47-53 degrees. More preferably, the shouldering angle may be 48-52 degrees. More preferably, the shouldering angle may be 49-51 degrees. A shoulder length may be 40-130 mm. More preferably, the shoulder length may be 50-120 mm. More preferably, the shoulder length may be 60-110 mm. More preferably, the shoulder length may be 70-100 mm. More preferably, the shoulder length may be 80-90 mm.

The constant diameter growth process may refer to a process in which a rod-like structure with a diameter determined during the shouldering process may be obtained. In some embodiments, the diameter of the crystal growth may be 10-200 mm. Preferably, the diameter of the crystal growth may be 20-180 mm. More preferably, the diameter of the crystal growth may be 50-150 mm. More preferably, the diameter of the crystal growth may be 60-140 mm, More preferably, the diameter of the crystal growth may be 70-130 mm. More preferably, the diameter of the crystal growth may be 80-120 mm. More preferably, the diameter of the crystal growth may be 90-110 mm.

The ending process may refer to a process in which the crystal may be raised up to be separated from the melt when the crystal grows to a predetermined length. The ending process may be a reverse operation of the shouldering process. The diameter of the crystal may be reduced until the crystal is separated from the melt by changing a pulling speed of the pulling rod, or the diameter of the crystal may be reduced to a preset diameter such as 10 mm. In some embodiments, an ending angle may be 30-70 degrees. Preferably, the ending angle may be 40-60 degrees. More preferably, the ending angle may be 45-55 degrees. More preferably, the ending angle may be 46-54 degrees. More preferably, the ending angle may be 47-53 degrees. More preferably, the ending angle may be 48-52 degrees. More preferably, the ending angle may be 49-51 degrees. An ending length of the crystal may be 40-110 mm. Preferably, the ending length of the crystal may be 50-100 mm. More preferably, the ending length of the crystal may be 60-90 mm. More preferably, the ending length of the crystal may be 70-80 mm.

During the crystal growth, reactant supplements may be added into the crystal growth device in real-time, that is, a real-time automatic feeding operation may be performed during the crystal growth. The automatic feeding operation may refer to an operation in which a liquid level position of the melt in the crucible is kept constant (i.e., a concentration of the melt is kept unchanged) during the crystal growth. When the added reactant supplements keep the concentration of the remaining melt in the crucible constant at all times, a concentration of the grown crystal can be constant, which can achieve a crystal growth with high uniformity, that is, the grown crystal has a high uniformity from top to bottom. In some embodiments, the automatic feeding operation may be activated at any time during the crystal growth, or performed during the entire crystal growth. In some embodiments, the automatic feeding operation may be performed within a specific time period of the crystal growth. In some embodiments, the time to activate the automatic feeding operation during the crystal growth may be determined based on technological requirements. For example, the automatic feeding operation may be performed during the seeding process, the necking process, the shouldering process, and the constant diameter growth process of the crystal growth. In some embodiments, adding the reactant supplements into the crystal growth device in real-time during the crystal growth may include obtaining a weight of the crystal being grown and adding the reactant supplements into the crystal growth device at least based on the weight of the crystal being grown. In some embodiments, the weight of the crystal being grown may be obtained by a weighing assembly. For example, the weighing assembly may be connected to the pulling rod to obtain the weight of the crystal growth based on the seed crystal. In some embodiments, the reactant supplements may include the reactants on which the first preprocessing operation has been performed. For example, when the grown crystal is a cerium-doped LSO, the reactant supplements may include $Lu_2O_3$, $SiO_2$, and $CeO_2$ on which the first preprocessing operation has been performed, which is exactly the same as the reactants. In some embodiments, the weight of the reactant supplements may be determined at least based on the weight of the crystal being grown and a ratio among the reactants for growing the crystal. For example, a concentration of the melt in the crucible and a concentration of the crystal at this time may be calculated based on the weight of the crystal being grown, a segregation coefficient, etc. (when the added reactant supplements keep the concentration and the components of the melt in the crucible constant, the concentration and the components of the melt may be the same as that of the grown crystal). Then the weight of the reactant supplements may be calculated based on the concentration of the melt and the chemical reaction equation of the crystal. More descriptions regarding the calculation of the weight of the reactant supplements may be found elsewhere in the present disclosure, for example, an example part, which are not repeated here.

In some embodiments, the automatic feeding operation may be performed by a feeding component. The feeding component may include a weighing assembly, a transfer assembly, and a control assembly. The weighing assembly may be configured to weigh the reactant supplements based on a supplement weight of the reactant supplements determined by the control assembly. The transfer assembly may be configured to transfer the reactant supplements weighed by the weighing assembly to the crucible. The control assembly may be configured to obtain a weight of the crystal being grown and determine the supplement weight of the reactant supplements at least based on the weight of the crystal being grown and a ratio among reactants for growing the crystal. The control assembly may further be configured to obtain a weight of the reactants weighed by the weighing assembly in real-time and control the transfer assembly to transfer the reactant supplements from the weighing assembly to the crucible when the weight of the reactant supplements weighed by the weighing assembly is equal to the supplement weight of the reactant supplements. In some embodiments, the feeding component may further include a holding assembly. The holding assembly may be configured to hold the reactant supplements. When the weight of the reactant supplements weighed by the weighing assembly is less than the supplement weight of the reactant supplements, the control assembly may control the holding assembly to transfer the reactant supplements to the weighing assembly. When the weight of the reactant supplements weighed by the weighing assembly is equal to the supplement weight of the reactant supplements, the control assembly may control the holding assembly to stop transferring the reactant supplements to the weighing assembly. More descriptions regarding the feeding component may be found elsewhere in the present disclosure (e.g., FIG. 2), which are not repeated here.

The cooling process may refer to a process in which a temperature may be slowly decreased after the ending process is completed, to eliminate a stress within the crystal, which may be formed in the high-temperature crystal growth, and prevent the crystal from cracking due to a sudden drop in temperature. According to a crystal growth method of the present disclosure, an annealing operation may be performed on the crystal during the cooling process. By introducing an oxygen-rich flowing gas into the crystal growth environment, on one hand, volatilization of the reactants may be reduced and a poor performance consistency of the crystal caused by the component deviation during the growth process may be reduced; on the other hand, an oxygen-deficient environment would not occur during the crystal growth, thereby reducing crystal lattice distortion caused by the occurrence of oxygen vacancies in the crystal. In this case, the annealing operation may be performed during the crystal growth, accordingly, it is not necessary to perform the annealing operation after the crystal growth. During the cooling process, when the temperature drops to a range of 1400-800 degrees Celsius, the volume ratio of oxygen in the flowing gas may be increased to cause the oxygen to effectively diffuse into the crystal. In some embodiments, during increasing the volume ratio of oxygen, a cooling rate of the crystal may also be slowed, or a stepwise cooling process may be performed to cause the oxygen to diffuse more Bally. In some embodiments, during the cooling process, when the temperature drops to the range of 1400-800 degrees Celsius, the volume ratio of oxygen in the flowing gas may be increased to 1-30%. Preferably, when the temperature drops to the range of 1400-800 degrees Celsius, the volume ratio of oxygen in the flowing gas may be increased to 2-28%. More preferably, when the temperature drops to the range of 1400-800 degrees Celsius, the volume ratio of oxygen in the flowing gas may be increased to 5-25%. More preferably, when the temperature drops to the range of 1400-800 degrees Celsius, the volume ratio of oxygen in the flowing gas may be increased to 10-20%. More preferably, when the temperature drops to the range of 1400-800 degrees Celsius, the volume ratio of oxygen in the flowing gas may be increased to 12-18%. More preferably, when the temperature drops to the range of 1400-800 degrees Celsius, the volume ratio of oxygen in the flowing gas may be increased to 13-17%. More preferably, when the temperature drops to the range of 1400-800 degrees Celsius, the volume ratio of oxygen in the flowing gas may be increased to 14-16%. More preferably, when the temperature drops to the range of 1400-800 degrees Celsius, the volume ratio of oxygen in the flowing gas may be increased to 15%. When the temperature is lower than 800 degrees Celsius, the volume ratio of oxygen in the flowing gas may be reduced to a volume ratio of oxygen in a previous crystal growth process, which may be 0.001-20% and other temperature ranges mentioned. In some embodiments, a cooling time of the crystal may be 20-100 hours, Preferably, the cooling time of the crystal may be 30-90 hours. More preferably, the cooling time of the crystal may be 40-80 hours. More preferably, the cooling time of the crystal may be 50-70 hours. More preferably, the cooling time of the crystal may be 55-65 hours. In some embodiments, assuming that T is the temperature after the ending process, a decreasing rate of a crystal temperature during the cooling process may be T/(20-100) hours. In some embodiments, the decreasing rate of the crystal temperature may be 15-95 degrees Celsius/hour. Preferably, the decreasing rate of the crystal temperature may be 20-65 degrees Celsius/hour. More preferably, the decreasing rate of the crystal temperature may be 23-47 degrees Celsius/hour. More preferably, the decreasing rate of the crystal temperature may be 26-38 degrees Celsius/hour. More preferably, the decreasing rate of the crystal temperature may be 28-34 degrees Celsius/hour. When an output heating power (e.g., the heating power of the induction coil) is 0, the crystal growth may end.

The crystal removing process may refer to a process in which the grown crystal may be taken out from the crystal growth device when an internal temperature of the crystal growth device drops to the room temperature. During the entire crystal growth process, according to settings of various process parameters in different stages of the crystal growth process, a growth rate of the crystal may be 0.01-6 mm/hour. Preferably, the growth rate of the crystal may be 0.1-6 mm/hour. More preferably, the growth rate of the crystal may be 1-6 mm/hour. More preferably, the growth rate of the crystal may be 2-5 mm/hour. More preferably, the growth rate of the crystal may be 3-4 mm/hour. A diameter of an obtained crystal may be 50-115 mm. A diameter of a grown crystal may be equal to or greater than 60 mm, such as 60-105 mm (e.g., 60 mm) or 70-90 mm (e.g., 80 mm). A constant diameter may be reached to more than 130 mm, such as 130-200 mm, 150-180 mm, or 160-170 mm.

In some embodiments, one or more processes in the crystal growth may be controlled by a proportional-integral-derivative (PID) controller. The one or more processes may include but not limited to the necking process, the shouldering process, the constant diameter growth process, the ending process, the cooling process, etc. In some embodiments, a PID parameter may be 0.1-5. Preferably, the PID parameter may be 0.5-4.5. More preferably, the PID parameter may be 1-4. More preferably, the PID parameter may be 1.5-3.5. More preferably, the PID parameter may be 2-3. More preferably, the FED parameter may be 2.5-3.5.

It should be noted that the embodiments mentioned above are only used to illustrate the technical solutions of the present disclosure but not to limit the technical solutions. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

A brief description of a temperature field device for growing the above-mentioned oxide crystal may be provided below. The temperature field device may include a bottom plate, a cover plate, a drum, and a filler. The bottom plate may be mounted on a bottom of the temperature field device and cover an open end of the drum. The cover plate may be mounted on a top of the temperature field device and cover the other open end of the drum. The filler may be filled inside the drum.

The bottom plate may be mounted on the bottom of the temperature field device and configured to support other components of the temperature field device, such as the drum and/or the filler. In some embodiments, a material of the bottom plate may include a heat-reflective material with a relatively high reflection coefficient, such as gold, silver, nickel, aluminum foil, copper, molybdenum, coated metal, stainless steel, etc. Preferably, the material of the bottom plate may be copper. Since the temperature field device may be placed inside a furnace body of the single crystal growth furnace when the temperature field device is in use, the bottom plate may be placed or mounted on a mounting plate of the furnace body. A mode of placing or mounting the bottom plate may include a welding connection, a riveting connection, a bolt connection, a bonding connection, etc. When the temperature field device is in use, an internal temperature of the temperature field device may reach a relatively high temperature, for example, 1900 Celsius degrees. Therefore, it is necessary to reduce the heat radiation of the temperature field device to prevent the furnace body from being damaged by receiving excessive heat. In this case, the bottom plate may be provided with circulating cooling medium channel(s), through which a circulating cooling medium may pass to absorb the heat inside the temperature field device, thereby insulating the heat and reducing the heat radiation. The circulating cooling medium channel(s) may be mounted inside the bottom plate in a spiral shape or a snake shape. A cooling manner may include liquid cooling, wind cooling, gas cooling, or other manner that can achieve the cooling purpose. When the liquid cooling is used, a cooling medium may include water, ethanol, ethylene glycol, isopropanol, n-hexane, or the like, or any combination thereof. For example, the cooling medium may include a 50:50 mixed liquid of water and ethanol. A count of the circulating cooling medium channel(s) may be one or more, for example, 1 to 3.

The drum may be mounted on the bottom plate and constitute an outer wall of the temperature field device. The bottom plate may cover an open end of the drum. The drum may be mounted on the bottom plate to support the temperature field device. The drum may be mounted on the bottom plate by a welding connection, a riveting connection, a bolt connection, a bonding connection, etc. Meanwhile, the cooperation of the drum and other components of the temperature field device, such as the bottom plate, the cover plate, etc., may achieve the sealing and the heat preservation of the temperature field device. In some embodiments, the drum may be made of a material with good heat resistance to achieve the purpose of maintaining a stable temperature during the crystal growth. The material of the drum may include zirconia, alumina, silicon oxide, graphite, ceramics, etc., or other high-temperature resistant materials.

The filler may be filled inside the drum for heat preservation. The filler may buffer the sudden temperature change that may occur in the temperature field device (e.g., when the temperature field device is connected to the outside air, which is caused by the cracking of the drum). In some embodiments, a shape of the filler may include a granular shape, a brick shape, and/or a felt shape. The filler may be made of high-temperature resistant materials, such as a zircon sand (a zirconium silicate compound), a zirconia particle, an alumina particle, a zirconia felt, a zirconia brick, etc. The filler may include a mixture of substances with a shape of granule, a shape of brick, or a shape of felt.

The cover plate may be mounted on the top of the temperature field device and configured to cooperate with other components, such as the drum and the bottom plate, to seal the temperature field device. The cover plate may cover the other open end of the drum. The cover plate may be connected to the drum in a connection manner such as a welding connection, a riveting connection, a bolt connection, a bonding connection, etc. For example, a silicone sealing ring may be used at a joint between the cover plate and the drum, and a screw may be used to screw and seal the cover plate and the drum. In some embodiments, the material of the cover plate may be similar to that of the bottom plate. The cover plate may also be made of a heat reflective material with a relatively high reflection coefficient, such as gold, silver, nickel, aluminum foil, copper, molybdenum, coated metal, stainless steel, etc. Preferably, the cover plate may be a copper plate. In some embodiments, the cover plate may include at least one first through hole. The first through hole may be configured to pass a gas through. For example, the first through hole may constitute a channel for the gas to enter into and exit the temperature field device. The gas may be introduced into the temperature field device through the first through hole, and then be discharged from temperature field device through the first through hole. In some embodiments, an observation assembly may be provided on the first through hole. The observation assembly may include an inner chamber communicating with the first through hole. The observation assembly may include a second through hole communicating with the inner chamber. The second through hole may be configured to pass a gas through. The observation assembly may also include an observation window. In some embodiments, the cover plate may also include a third through hole to allow the pulling rod to enter and exit the temperature field device. Meanwhile, the gas may also be discharged from the third through hole.

Figure 2:
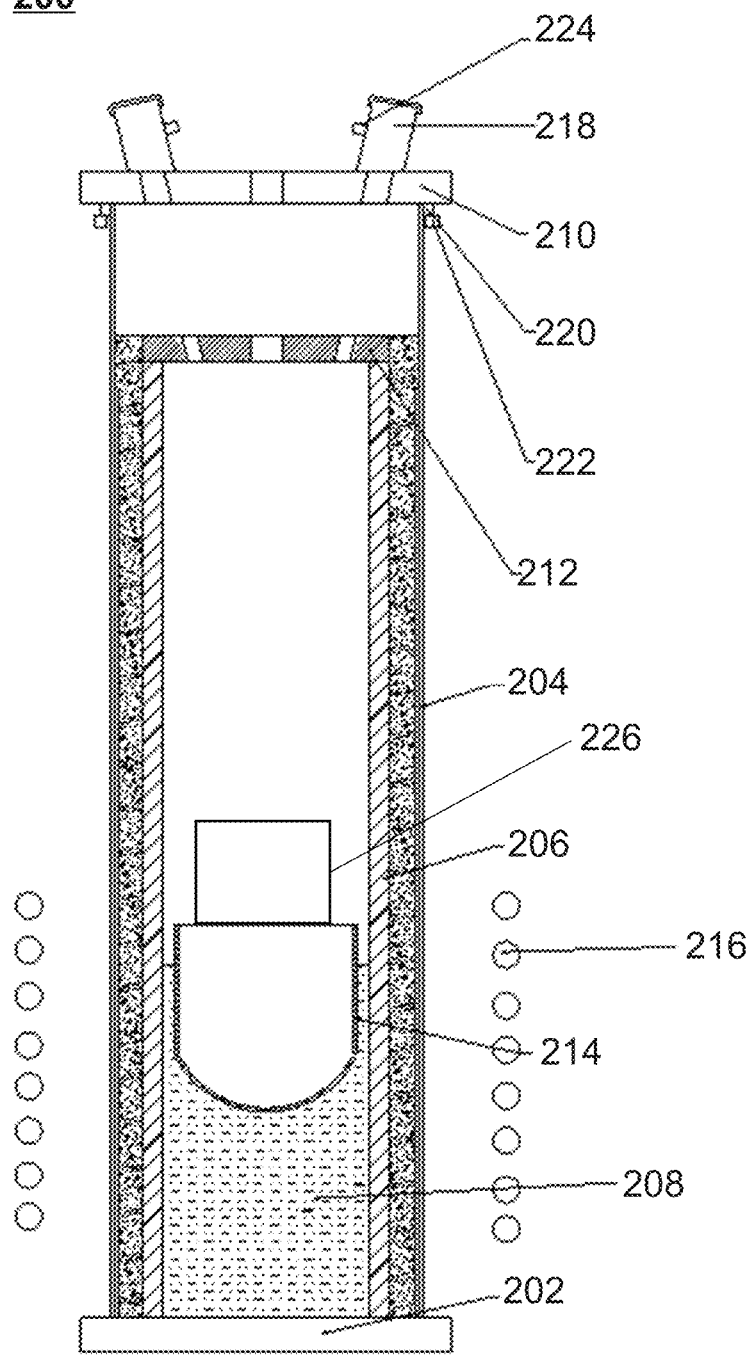
FIG. 2 is a schematic diagram illustrating an exemplary temperature field device according to some embodiments of the present disclosure.

FIG. 2 is a schematic diagram illustrating an exemplary temperature field device 200 according to some embodiments of the present disclosure. It should be noted that FIG. 2 is provided for illustration purposes and does not limit the specific shape and structure of the temperature field device. The temperature field device 200 may be placed in a crystal growth furnace to provide a temperature gradient required by crystal growth and ensure the stability of a crystallization process of the crystal. As shown in FIG. 2, the temperature field device 200 may include a bottom plate 202, a first drum 204, a second drum 206, a filler 208, a first cover plate 210, a second cover plate 212, a heater 226, an observation assembly 218, a sealing ring 220, a pressure ring 222, and a gas channel 224. When the temperature field device 200 is in use, the temperature field device 200 may be placed in the crystal growth device, such as a single crystal growth furnace, and located in an induction coil 216 in the furnace. A crucible 214 may be placed inside the temperature field device 200, and the heater 226 may be arranged directly above the crucible 214.

The bottom plate 202 may be mounted on a bottom of the temperature field device 200 to support other components (e.g., the first drum 106, the second drum 108, and/or the filler 110) of the temperature field device 200. In some embodiments, a material of the bottom plate 202 may include a heat-reflective material with a high reflection coefficient, such as gold, silver, nickel, aluminum foil, copper, molybdenum, coated metal, stainless steel, etc. Preferably, the material of the bottom plate 202 may be copper. In some embodiments, a diameter of the bottom plate 202 may be 200-500 mm. More preferably, the diameter of the bottom plate 202 may be 250-450 mm. More preferably, the diameter of the bottom plate 202 may be 300-400 mm. More preferably, the diameter of the bottom plate 202 may be 310-390 mm. More preferably, the diameter of the bottom plate 202 may be 320-380 mm. More preferably, the diameter of the bottom plate 202 may be 330-370 mm. More preferably, the diameter of the bottom plate 202 may be 440-360 mm. In some embodiments, a thickness of the bottom plate 202 may be 10-40 mm. More preferably, the thickness of the bottom plate 202 may be 15-35 mm. More preferably, the thickness of the bottom plate 202 may be 20-30 mm. More preferably, the thickness of the bottom plate 202 may be 21-29 mm. More preferably, the thickness of the bottom plate 202 may be 22-28 mm. More preferably, the thickness of the bottom plate 202 may be 23-27 mm. More preferably, the thickness of the bottom plate 202 may be 24-26 mm. Since the temperature field device 200 may be placed inside a furnace body of the single crystal growth furnace, the bottom plate 202 may be placed or mounted on a mounting plate of the furnace body. A mode of placing or mounting the bottom plate may include a welding connection, a riveting connection, a bolt connection, a bonding connection, etc. During the bottom plate 202 is being mounted, a level requirement of the bottom plate 202 may be less than 0.5 mm/m. The mm/m refers to a height difference (mm) between two ends of the bottom plate 202 of a unit length (m). More preferably, the level requirement of the bottom plate 202 may be less than 0.4 mm/m. More preferably, the level requirement of the bottom plate 202 may be less than 0.3 mm/m. More preferably, the level requirement of the bottom plate 202 may be less than 0.2 mm/m. More preferably, the level requirement of the bottom plate 202 may be less than 0.1 mm/m. More preferably, the level requirement of the bottom plate 202 may be less than 0.09 mm/m. More preferably, the level requirement of the bottom plate 202 may be less than 0.08 mm/m. More preferably, the level requirement of the bottom plate 202 may be less than 0.07 mm/m. More preferably, the level requirement of the bottom plate 202 may be less than 0.06 mm/m. More preferably, the level requirement of the bottom plate 202 may be less than 0.05 mm/m. More preferably, the level requirement of the bottom plate 202 may be less than 0.04 mm/m. More preferably, the level requirement of the bottom plate 202 may be less than 0.03 mm/m. More preferably, the level requirement of the bottom plate 202 may be less than 0.02 mm/m. More preferably, the level requirement of the bottom plate 202 may be less than 0.01 mm/m. When using the temperature field device 200, the internal temperature may reach a higher level, for example, 1900 Celsius degrees. Therefore, it is necessary to reduce the heat radiation of the temperature field device 200 to prevent the furnace body from being damaged by receiving excessive heat. In this case, the bottom plate 202 may be provided with circulating cooling medium channel(s), through which a circulating cooling medium may pass to absorb the heat inside the temperature field device 200, thereby insulating the heat and reducing the heat radiation. The circulating cooling medium channel(s) may be arranged inside the bottom plate 202 in a spiral shape or a snake shape. A cooling manner may include liquid cooling, wind cooling, gas cooling, or other manner that can achieve the cooling purpose. When the liquid cooling is used, a cooling medium may include water, ethanol, ethylene glycol, isopropanol, n-hexane, or the like, or any combination thereof. For example, the cooling medium may include a 50:50 mixture of water and ethanol. A count of the circulating cooling medium channel(s) may be one or more, for example, 1 to 3. In some embodiments, diameter(s) of the circulating cooling medium channel(s) may be 5-25 mm. Preferably, the diameter(s) of the circulating cooling medium channel(s) may be 10-20 mm. Preferably, the diameter(s) of the circulating cooling medium channel(s) may be 11-19 mm. Preferably, the diameter(s) of the circulating cooling medium channel(s) may be 12-18 mm. Preferably, diameter(s) of the circulating cooling medium channel(s) may be 13-17 mm. Preferably, diameter(s) of the circulating cooling medium channel(s) may be 14-15 mm.

The first drum 204 may be mounted on the bottom plate 202 and constitute an outer wall of the temperature field device 200. The bottom plate 202 may cover an open end of the first drum 204. The first drum 204 may be mounted on the bottom plate 202 to support the temperature field device 200. The first drum 204 may be mounted on the bottom plate 202 by a connection manner such as a welding connection, a riveting connection, a bolt connection, a bonding connection, etc. Meanwhile, the cooperation of the first drum 204 and other components of the temperature field device 200 (e.g., the bottom plate 202, the first cover plate 112, etc.) may achieve the sealing and the heat preservation of the temperature field device 200. When the first drum 204 is mounted, a concentricity between the first drum 204 and the bottom plate 202 may be less than 1 mm. More preferably, the concentricity between the first drum 204 and the bottom plate 202 may be less than 0.9 mm. More preferably, the concentricity between the first drum 204 and the bottom plate 202 may be less than 0.8 mm. More preferably, the concentricity between the first drum 204 and the bottom plate 202 may be less than 0.7 mm. More preferably, the concentricity between the first drum 204 and the bottom plate 202 may be less than 0.6 mm. More preferably, the concentricity between the first drum 204 and the bottom plate 202 may be less than 0.5 mm. More preferably, the concentricity between the first drum 204 and the bottom plate 202 may be less than 0.4 mm. More preferably, the concentricity between the first drum 204 and the bottom plate 202 may be less than 0.3 mm. More preferably, the concentricity between the first drum 204 and the bottom plate 202 may be less than 0.2 mm. More preferably, the concentricity between the first drum 204 and the bottom plate 202 may be less than 0.1 mm. A perpendicularity between the first drum 204 and the bottom plate 202 may be less than 0.2 degrees. More preferably, the perpendicularity between the first drum 204 and the bottom plate 202 may be less than 0.15 degrees. More preferably, the perpendicularity between the first drum 204 and the bottom plate 202 may be less than 0.1 degrees. More preferably, the perpendicularity between the first drum 204 and the bottom plate 202 may be less than 0.05 degrees. More preferably, the perpendicularity between the first drum 204 and the bottom plate 202 may be less than 0.03 degrees. In some embodiments, the first drum 204 may be made of quartz (silicon oxide), corundum (alumina), zirconium oxide, graphite, carbon fiber, ceramics, etc., or other high-temperature-resistant materials such as boride, carbide, nitride, silicide, phosphide, sulfide, etc. of rare-earth metals. Preferably, the first drum 204 may be a quartz tube or a corundum tube. According to the size of the bottom plate 202, an inner diameter of the first drum 204 may be 180-450 mm. More preferably, the inner diameter of the first drum 204 may be 200-430 mm. More preferably, the inner diameter of the first drum 204 may be 220-410 mm. More preferably, the inner diameter of the first drum 204 may be 250-380 mm. More preferably, the inner diameter of the first drum 204 may be 270-360 mm. More preferably, the inner diameter of the first drum 204 may be 300-330 mm. Preferably, the inner diameter of the first drum 204 may be 310-320 mm. In some embodiments, a thickness of the first drum 204 may be 1-15 mm. More preferably, the thickness of the first drum 204 may be 3-12 mm. More preferably, the thickness of the first drum 204 may be 5-10 mm. More preferably, the thickness of the first drum 204 may be 6-9 mm. More preferably, the thickness of the first drum 204 may be 7-8 mm. A height of the first drum 204 may be 600-1600 mm. More preferably, the height of the first drum 204 may be 700-1500 mm. More preferably, the height of the first drum 204 may be 800-1400 mm. More preferably, the height of the first drum 204 may be 900-1300 mm. More preferably, the height of the first drum 204 may be 1000-1200 mm. More preferably, the height of the first drum 204 may be 1050-1150 mm. More preferably, the height of the first drum 204 may be 1060-1140 mm. More preferably, the height of the first drum 204 may be 1070-1130 mm. More preferably, the height of the first drum 204 may be 1080-1120 mm. More preferably, the height of the first drum 204 may be 1090-1110 mm. More preferably, the height of the first drum 204 may be 1095-1105 mm.

The second drum 206 may be mounted inside the first drum 204. In some embodiments, the second drum 206 may be made of a material with relatively good heat resistance to maintain temperature stability during crystal growth. The second drum 206 may be made of silicon oxide, zirconium oxide, aluminum oxide, graphite, ceramics, etc. Preferably, the second drum 206 may be a zirconium tube made of zirconia. To match the size of the first drum 204, an inner diameter of the second drum 206 may be 70-300 mm. More preferably, the inner diameter of the second drum 206 may be 100-270 mm. More preferably, the inner diameter of the second drum 206 may be 120-250 mm. More preferably, the inner diameter of the second drum 206 may be 150-220 mm. More preferably, the inner diameter of the second drum 206 may be 170-200 mm. More preferably, the inner diameter of the second drum 206 may be 180-270 mm. A thickness of the second drum 206 may be 8-30 mm. More preferably, the thickness of the second drum 206 may be 10-30 mm. More preferably, the thickness of the second drum 206 may be 15-25 mm. More preferably, the thickness of the second drum 206 may be 16-24 mm. More preferably, the thickness of the second drum 206 may be 17-23 mm. More preferably, the thickness of the second drum 206 may be 18-22 mm. More preferably, the thickness of the second drum 206 may be 19-21 mm. In some embodiments, one end of the second drum 206 may be placed or installed on the bottom plate 202 by, for example, a bonding connection, a welding connection, a riveting connection, a key connection, a bolt connection, a buckle connection, etc. During installation, a concentricity between the second drum 206 and the bottom plate 202 may be less than 1 mm. More preferably, the concentricity between the second drum 206 and the bottom plate 202 may be less than 0.9 mm. More preferably, the concentricity between the second drum 206 and the bottom plate 202 may be less than 0.8 mm. More preferably, the concentricity between the second drum 206 and the bottom plate 202 may be less than 0.7 mm. More preferably, the concentricity between the second drum 206 and the bottom plate 202 may be less than 0.6 mm. More preferably, the concentricity between the second drum 206 and the bottom plate 202 may be less than 0.5 mm. More preferably, the concentricity between the second drum 206 and the bottom plate 202 may be less than 0.4 mm. More preferably, the concentricity between the second drum 206 and the bottom plate 202 may be less than 0.3 mm. More preferably, the concentricity between the second drum 206 and the bottom plate 202 may be less than 0.2 mm. More preferably, the concentricity between the second drum 206 and the bottom plate 202 may be less than 0.1 mm. More preferably, the concentricity between the second drum 206 and the bottom plate 202 may be less than 0.05 mm. In addition, a perpendicularity of the second drum 206 may be less than 0.2 degrees. More preferably, the perpendicularity of the second drum 206 may be less than 0.15 degrees. More preferably, the perpendicularity of the second drum 206 may be less than 0.1 degrees. More preferably, the perpendicularity of the second drum 206 may be less than 0.08 degrees. More preferably, the perpendicularity of the second drum 206 may be less than 0.05 degrees. In some embodiments, when the second drum 206 is mounted on the bottom plate 202, according to different lengths, the second drum 206 may be in different mounting states. When a length of the second drum 206 is the same as that of the first drum 204, a mounting state of the second drum 206 may be similar to that of the first drum 204, that is, one open end of the second drum 206 may be connected to the bottom plate 202 and the other open end of the second drum 206 may be connected to the first cover plate 112. When the length of the second drum 206 is smaller than the first drum 204, the other open end of the second drum 206 may be connected to other components (e.g., the second cover plate 212) of the temperature field device 200. The second cover plate 212 may cover the other open end of the second drum 206. Meanwhile, a size and/or a shape of the second cover plate 212 (e.g., a diameter of a circle cover plate) may be matched with a cross-section of the first drum 204 to achieve a seamless connection with the first drum 204. In some embodiments, the second drum 206 may not be mounted on the bottom plate 202. When the length of the second drum 206 is smaller than that of the first drum 204, one end of the second drum 206 may be mounted on other components (e.g., the first cover plate 210 and the second cover plate 212) of the temperature field device 200, and the other end of the second drum 206 may be kept at a certain distance from the bottom plate 202 (e.g., in a floating state). In some embodiments, the length of the second drum 206 may be consistent with that of the first drum 204. In some embodiments, the length of the second drum 206 may be 500-1500 mm, More preferably, the length of the second drum 206 may be 600-1400 mm. More preferably, the length of the second drum 206 may be 700-1300 mm. More preferably, the length of the second drum 206 may be 800-1200 mm. More preferably, the length of the second drum 206 may be 900-1100 mm. More preferably, the length of the second drum 206 may be 950-1050 mm. More preferably, the length of the second drum 206 may be 960-1040 mm. More preferably, the length of the second drum 206 may be 970-1030 mm. More preferably, the length of the second drum 206 may be 980-1020 mm. More preferably, the length of the second drum 206 may be 990-1010 mm.

The filler 208 may be filled in the second drum 206, and/or a space between the first drum 204 and the second drum 206. The filler 208 may be configured for heat preservation. In some embodiments, a thickness, a height, and/or a tightness of the filler 208 may change a position of a component (e.g., the crucible 214) supported by the filler 208, a space volume of the heat dissipation in the temperature field device 200, and/or a temperature gradient required by the crystal growth. By changing the thickness, the height and/or the tightness of the filler 208, different stable temperature gradients may be obtained to meet different crystal growth requirements. Meanwhile, when the second drum 206 cracks, the filler 208 filled in the space between the first drum 204 and the second drum 206 may act as a thermal insulation layer to prevent a change caused by a communication between the temperature field device 200 and the external environment, which may affect the crystal growth. The thermal insulation layer formed by the filler 208 may maintain the temperature gradient in the temperature field device 200 in the above-mentioned case to avoid the sudden change of the temperature gradient. In some embodiments, the filler 208 may also buffer the sudden temperature change when the second drum 206 cracks. In some embodiments, the filler 208 may be made of a high-temperature-resistant material, such as silicon oxide, aluminum oxide, zirconium oxide, graphite, carbon fiber, ceramics, and boride, carbide, nitride, silicide, phosphide, sulfide, etc. of rare-earth metals, etc. In some embodiments, the filler 208 may include a zircon sand (a zirconium silicate compound), a zirconia particle, or an alumina particle. A particle size of the filler 208 may be 5-200 mesh. More preferably, the particle size of the filler 208 may be 10-190 mesh. More preferably, the particle size of the filler 208 may be 20-180 mesh. More preferably, the particle size of the filler 208 may be 30-170 mesh. More preferably, the particle size of the filler 208 may be 40-160 mesh. More preferably, the particle size of the filler 208 may be 50-150 mesh. More preferably, the particle size of the filler 208 may be 60-140 mesh. More preferably, the particle size of the filler 208 may be 70-130 mesh. More preferably, the particle size of the filler 208 may be 80-120 mesh. More preferably, the particle size of the filler 208 may be 90-110 mesh, More preferably, the particle size of the filler 208 may be 95-105 mesh. In some embodiments, the filler 208 may include a substance with a shape of felt (e.g., a zirconia felt). In some embodiments, the filler 208 may include a substance with a shape of brick (e.g., a zirconia brick, and/or an alumina brick). In some embodiments, the filler 208 may include a mixture of any two or more substances with a shape of particle, a shape of brick, or a shape of felt. For example, the filler 208 may include a mixture of at least one of a zirconia felt, zirconia sand, a zirconia particle, and an alumina particle.

In some embodiments, the filler 208 filled in the second drum 206 may be configured to support the crucible 214 containing the reactants for crystal growth. The filler 208 may cover a portion of the crucible 214, for example, a bottom and a sidewall of the crucible. To prevent the filler 208 from falling into the reactants in the crucible 214, an upper edge of the crucible 214 may be higher than a filling height of the filler 208 filled in the second drum 206. On the other hand, the second drum 206 may also prevent the filler 208 filled in the space between the first drum 204 and the second drum 206 from falling into the crucible 214. In some embodiments, the crucible 214 may be made of iridium (Ir), molybdenum (Mo), tungsten (W), rhenium (Re), graphite (C), tungsten-molybdenum alloy, etc. Preferably, the crucible 214 may be an iridium crucible. In some embodiments, a diameter of the crucible 214 may be 60-250 mm, More preferably, the diameter of the crucible 214 may be 80-220 mm, More preferably, the diameter of the crucible 214 may be 100-200 mm, More preferably, the diameter of the crucible 214 may be 110-190 mm. More preferably, the diameter of the crucible 214 may be 120-180 mm. More preferably, the diameter of the crucible 214 may be 130-170 mm, More preferably, the diameter of the crucible 214 may be 140-160 mm. More preferably, the diameter of the crucible 214 may be 145-155 mm. A thickness of the crucible 214 may be 2-4 mm. More preferably, the thickness of the crucible 214 may be 2.2-3.8 mm. More preferably, the thickness of the crucible 214 may be 2.5-3.5 mm. More preferably, the thickness of the crucible 214 may be 2.6-3.4 mm. More preferably, the thickness of the crucible 214 may be 2.7-3.3 mm. More preferably, the thickness of the crucible 214 may be 2.8-3.2 mm. More preferably, the thickness of the crucible 214 may be 2.9-3.1 mm. A height of the crucible 214 may be 60-250 mm. More preferably, the height of the crucible 214 may be 80-220 mm. More preferably, the height of the crucible 214 may be 100-200 mm. More preferably, the height of the crucible 214 may be 110-190 mm. More preferably, the height of the crucible 214 may be 120-180 mm. More preferably, the height of the crucible 214 may be 130-170 mm. More preferably, the height of the crucible 214 may be 140-160 mm. More preferably, the height of the crucible 214 may be 145-155 mm.

The heater 226 may be mounted above the crucible 214. In some embodiments, the heater 226 may be used to reduce a temperature gradient above the crucible 214. A position or an inner diameter of the heater 226 may provide the crystal with a temperature required for annealing when the seed crystal passes through the heater 226, so that an annealing operation can be simultaneously performed during the crystal growth. In some embodiments, the heater 226 may be made of iridium (Ir), platinum (Pt), molybdenum (Mo), tungsten (W), rhenium (Re), graphite (C), tungsten-molybdenum alloy, or a high-temperature-resistant material with a high melting point that can be heated by electromagnetic induction, or the like, or any combination thereof. The above-mentioned high melting point may refer to that the melting point of the material of the heater 226 is higher than a temperature required in the crystal growth or a temperature that a temperature inside the crystal growth device can reach. The above-mentioned high-temperature-resistant may refer to that a resistant temperature of the material of the heater 226 is higher than the temperature required in the crystal growth or the temperature that the temperature inside the crystal growth device can reach, for example, 2100 degrees Celsius. In some embodiments, an outer diameter of the heater 226 may be 60-260 mm. Preferably, the outer diameter of the heater 226 may be 80-220 mm. More preferably, the outer diameter of the heater 226 may be 100-200 mm. More preferably, the outer diameter of the heater 226 may be 110-190 mm. More preferably, the outer diameter of the heater 226 may be 120-180 mm. More preferably, the outer diameter of the heater 226 may be 130-170 mm. More preferably, the outer diameter of the heater 226 may be 140-160 mm. More preferably, the outer diameter of the heater 226 may be 145-155 mm. An inner diameter of the heater 226 may be 40-240 mm. Preferably, the inner diameter of the heater 226 may be 60-220 mm. More preferably, the inner diameter of the heater 226 may be 80-200 mm. More preferably, the inner diameter of the heater 226 may be 90-190 mm. More preferably, the inner diameter of the heater 226 may be 100-180 mm. More preferably, the inner diameter of the heater 226 may be 110-170 mm. More preferably, the inner diameter of the heater 226 may be 120-160 mm. More preferably, the inner diameter of the heater 226 may be 130-150 mm. More preferably, the inner diameter of the heater 226 may be 135-145 mm. A thickness of the heater 226 may be 2-10 mm. Preferably, the thickness of the heater 226 may be 3-9 mm. More preferably, the thickness of the heater 226 may be 4-8 mm. More preferably, the thickness of the heater 226 may be 5-7 mm. More preferably, the thickness of the heater 226 may be 5.5-6.5 mm. More preferably, the thickness of the heater 226 may be 5.6-6.4 mm, More preferably, the thickness of the heater 226 may be 5.8-6.2 mm. More preferably, the thickness of the heater 226 may be 5.9-6.1 mm. A height of the heater 226 may be 2-200 mm. Preferably, the height of the heater 226 may be 10-180 mm. More preferably, the height of the heater 226 may be 30-160 mm. More preferably, the height of the heater 226 may be 50-120 mm. More preferably, the height of the heater 226 may be 60-110 mm. More preferably, the height of the heater 226 may be 70-100 mm. More preferably, the height of the heater 226 may be 80-90 mm. More preferably, the height of the heater 226 may be 85-95 mm.

Figure 3:
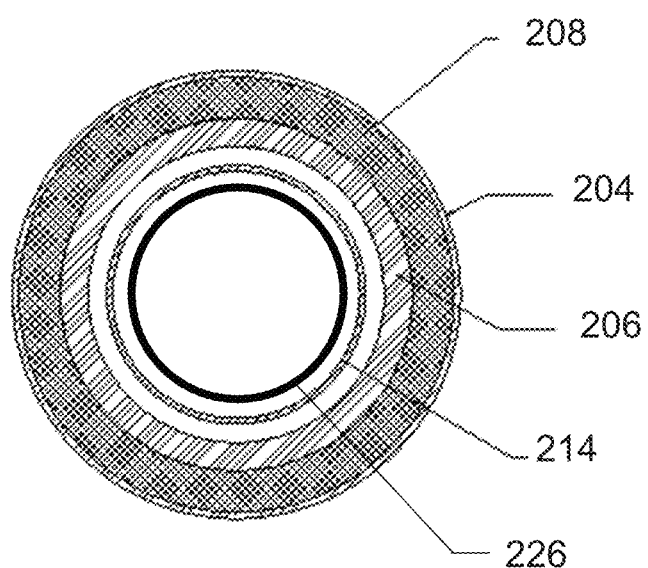
FIG. 3 is a schematic diagram illustrating a top view of an exemplary temperature field device according to some embodiments of the present disclosure.

FIG. 3 is a schematic diagram illustrating a top view of an exemplary temperature field device 200 according to some embodiments of the present disclosure. As shown in FIG. 3, a periphery of the temperature field device 200 may be the first drum 204. The gap between the second drum 206 and the first drum 204 may be filled with the filler 208. The crucible 214 may be placed in the second drum 206, and supported by the filler 208 which is filled at a bottom of the second drum 206. It can be seen that, from outside to inside, components of the temperature field device 200 may successively include the first drum 204, the filler 208, the second drum 206, and the crucible 214. Meanwhile, the above-mentioned four components may form a concentric circle and a concentricity may be less than 1 mm. More preferably, the concentricity may be less than 0.9 mm. More preferably, the concentricity may be less than 0.8 mm. More preferably, the concentricity may be less than 0.7 mm. More preferably, the concentricity may be less than 0.6 mm. More preferably, the concentricity may be less than 0.5 mm. More preferably, the concentricity may be less than 0.4 mm. More preferably, the concentricity may be less than 0.3 mm. More preferably, the concentricity may be less than 0.2 mm. More preferably, the concentricity may be less than 0.1 mm. The formed concentric circle may be beneficial for growing crystals, observing the crystal growth, filling flowing gas, and pulling up the crystals.

In some embodiments, the crucible 214 may be used as a heater to melt the reactants contained therein to facilitate subsequent crystal growth. An induction coil (e.g., the induction coil 216 illustrated in FIG. 1) surrounding the outer wall of the first drum 204 may generate an alternating magnetic field when an alternating current with a certain frequency is energized. A closed induced current (i.e., an eddy current) may be generated in a conductor (e.g., the crucible 214) caused by the electromagnetic induction of the alternating magnetic field. The induced current may be unevenly distributed on a cross-section of the conductor and the electrical energy of a high-density current on a surface of the conductor may be converted into heat energy to increase the temperature of the conductor to melt the reactants. The induction coil 216 may include a coil with 7-12 turns. More preferably, the induction coil 216 may include a coil with 8-11 turns. More preferably, the induction coil 216 may include a coil with 9-10 turns. An induction frequency may be 2 kHz-15 kHz. More preferably, the induction frequency may be 3 kHz-14 kHz. More preferably, the induction frequency may be 4 kHz-13 kHz. More preferably, the induction frequency may be 5 kHz-12 kHz. More preferably, the induction frequency may be 6 kHz-11 kHz. More preferably, the induction frequency may be 7 kHz-10 kHz. More preferably, the induction frequency may be 8 kHz-9 kHz. In some embodiments, the filling height of the filler 208 may result in that a vertical distance between an upper edge of the crucible 214 and an upper edge of the induction coil 216 is 0 mm to ±50 mm (i.e., −50 mm to 50 mm), wherein, "−" refers to that the upper edge of the crucible 214 is lower than the upper edge of the induction coil 216, and "+" refers to that the upper edge of the crucible 214 is higher than the upper edge of the induction coil 216. More preferably, the vertical distance between the upper edge of the crucible 214 and the upper edge of the induction coil 216 may be −5 mm to +45 mm. More preferably, the vertical distance between the upper edge of the crucible 214 and the upper edge of the induction coil 216 may be −40 mm to +40 mm. More preferably, the vertical distance between the upper edge of the crucible 214 and the upper edge of the induction coil 216 may be −35 mm to +35 mm. More preferably, the vertical distance between the upper edge of the crucible 214 and the upper edge of the induction coil 216 may be −30 mm to +30 mm. More preferably, the vertical distance between the upper edge of the crucible 214 and the upper edge of the induction coil 216 may be −25 mm to +25 mm. The temperature gradient of the temperature field device 200 can be adjusted by changing a relative position between the crucible 214 and the induction coil 216. For example, the heat generated by the crucible 214 when the crucible 214 is totally within the coil range of the induction coil 216 may be relatively larger than that generated by the crucible 214 when only a portion of the crucible 214 is in the coil range of the induction coil 216, Accordingly, the heat position and/or a space size of heat dissipation in the temperature field device 200 may be determined, and the temperature gradient may be further affected.

The first cover plate 210 may be mounted on a top of the temperature field device 200 and configured to seal the temperature field device 200 together with other components (e.g., the first drum 204). The first cover plate 210 may cover the other open end of the first drum 204. The first cover plate 210 may be connected to the first drum 204 by a welding connection, a riveting connection, a bolt connection, a bonding connection, or the like. For example, a silicone sealing ring may be used at a joint between the first cover plate 210 and the first drum 204, and a screw may be used to screw and seal the first cover plate 210 and the first drum 204. In some embodiments, a material of the first cover plate 210 may be similar to that of the bottom plate 202. The first cover plate 210 may be made of a heat-reflective material with a high reflection coefficient, such as gold, silver, nickel, aluminum foil, copper, molybdenum, coated metal, stainless steel, etc. Preferably, the first cover plate 210 may be a copper plate. During the installation, a concentricity of the first cover plate 210 and the first drum 204 may be less than 0.5 mm. More preferably, the concentricity of the first cover plate 210 and the first drum 204 may be less than 0.4 mm, More preferably, the concentricity of the first cover plate 210 and the first drum 204 may be less than 0.3 mm. More preferably, the concentricity of the first cover plate 210 and the first drum 204 may be less than 0.2 mm. More preferably, the concentricity of the first cover plate 210 and the first drum 204 may be less than 0.1 mm. In some embodiments, a diameter of the first cover plate 210 may be 200-500 mm. More preferably, the diameter of the first cover plate 210 may be 250-450 mm. More preferably, the diameter of the first cover plate 210 may be 300-400 mm. More preferably, the diameter of the first cover plate 210 may be 310-390 mm. More preferably, the diameter of the first cover plate 210 may be 320-380 mm. More preferably, the diameter of the first cover plate 210 may be 330-370 mm, More preferably, the diameter of the first cover plate 210 may be 340-360 mm. In some embodiments, a thickness of the first cover plate 210 may be 10-40 mm. More preferably, the thickness of the first cover plate 210 may be 15-35 mm. More preferably, the thickness of the first cover plate 210 may be 20-30 mm. More preferably, the thickness of the first cover plate 210 may be 21-29 mm. More preferably, the thickness of the first cover plate 210 may be 22-28 mm. More preferably, the thickness of the first cover plate 210 may be 23-27 mm. More preferably, the thickness of the first cover plate 210 may be 24-26 mm. In some embodiments, the first cover plate 210 may include at least one first through hole. The at least one first through hole may be configured for gas to pass through. For example, the at least one first through hole may constitute a channel for the gas to enter into and/or exit from the temperature field device 200. The gas may be filled into the temperature field device 200 through at least one first through hole and be exhausted from the temperature field device 200 through remaining first through hole(s) or the first through hole(s) through which the gas is filled. In some embodiments, the gas may include at least one of oxygen and/or inert gas. The inert gas may include nitrogen, helium, neon, amon, krypton, xenon, radon, etc. In some embodiments, the gas may include a mixed gas of oxygen with one or more inert gases. In some embodiments, the gas may include a mixed gas of hydrogen and/or carbon monoxide with one or more inert gases. In some embodiments, the gas may include one or more of nitrogen, argon, oxygen, or carbon monoxide, According to the characteristics and size of the crystal to be grown, a flow rate of the gas filled into the temperature field device 200 may be 0.01-50 L/min. More preferably, the flow rate of the filled gas may be 0.01-50 L/min. More preferably, the flow rate of the filled gas may be 0.1-50 L/min, More preferably, the flow rate of the filled gas may be 1-50 L/min. More preferably, the flow rate of the filled gas may be 5-45 L/min. More preferably, the flow rate of the filled gas may be 10-40 L/min. More preferably, the flow rate of the filled gas may be 15-35 L/min. Preferably, the flow rate of the filled gas may be 20-30 L/min. More preferably, the flow rate of the filled gas may be 21-29 L/min. More preferably, the flow rate of the filled gas may be 22-28 L/min. More preferably, the flow rate of the filled gas may be 23-27 L/min. More preferably, the flow rate of the filled gas may be 24-26 L/min.

Figure 4:
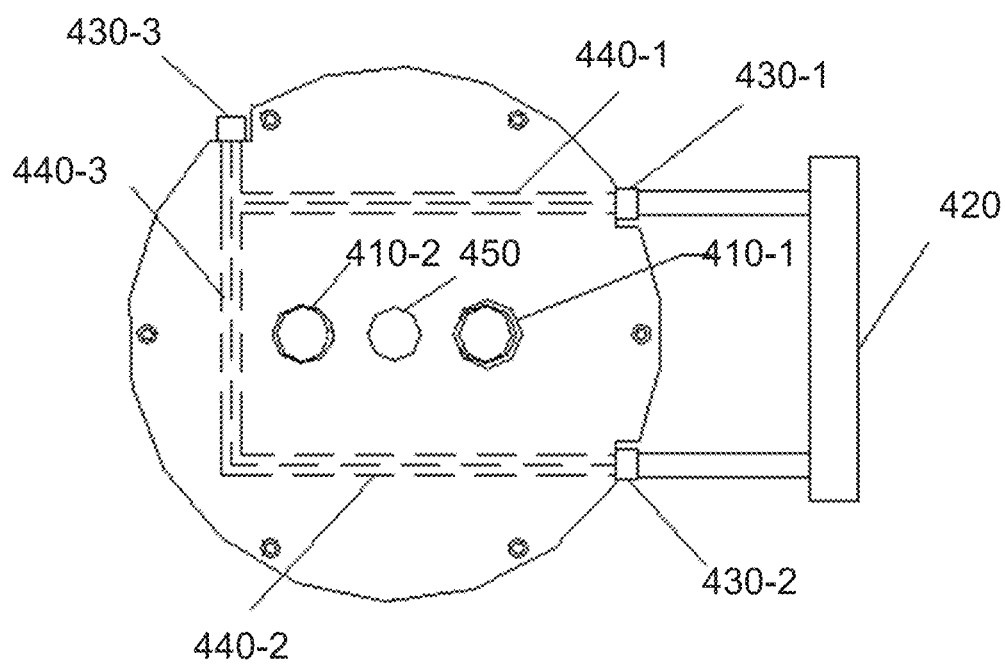
FIG. 4 is a schematic diagram illustrating an exemplary first cover plate according to some embodiments of the present disclosure.

In some embodiments, other components may be mounted on the first cover 210. FIG. 4 is a schematic diagram illustrating a top view of an exemplary first cover plate 210 according to some embodiments of the present disclosure. As shown in FIG. 4, the first cover plate 210 may include two first through holes 410-1 and 410-2 through which a gas may enter into and/or exit from the temperature field device 200. In some embodiments, diameters of the first through holes 410-1 and 410-2 may be 15-30 mm. More preferably, the diameters of the first through holes 410-1 and 410-2 may be 18-27 mm. More preferably, the diameters of the first through holes 410-1 and 410-2 may be 20-25 mm. More preferably, the diameters of the first through holes 410-1 and 410-2 may be 21-24 mm. More preferably, the diameters of the first through holes 410-1 and 410-2 may be 22-23 mm. In some embodiments, rotation central axes of the first through holes 410-1 and 410-2 may be perpendicular to the horizontal plane. In some embodiments, angles between the rotation central axes of the first through holes 410-1 and 410-2 and a vertical line of the horizontal plan may be 3-20 degrees. More preferably, the angles between the rotation central axes of the first through holes 410-1 and 410-2 and a vertical line of the horizontal plan may be 5-18 degrees. More preferably, the angles between the rotation central axes of the first through holes 410-1 and 410-2 and a vertical line of the horizontal plan may be 7-15 degrees. More preferably, the angles between the rotation central axes of the first through holes 410-1 and 410-2 and a vertical line of the horizontal plan may be 9-13 degrees. More preferably, the angles between the rotation central axes of the first through holes 410-1 and 410-2 and a vertical line of the horizontal plan may be 11-12 degrees. A distance between centers of the two through holes may be 70-150 mm, More preferably, the distance between centers of the two through holes may be 80-140 mm. More preferably, the distance between centers of the two through holes may be 90-130 mm. More preferably, the distance between centers of the two through holes may be 100-120 mm. More preferably, the distance between centers of the two through holes may be 105-115 mm. More preferably, the distance between centers of the two through holes may be 107-113 mm. More preferably, the distance between centers of the two through holes may be 109-111 mm.

Figure 5:
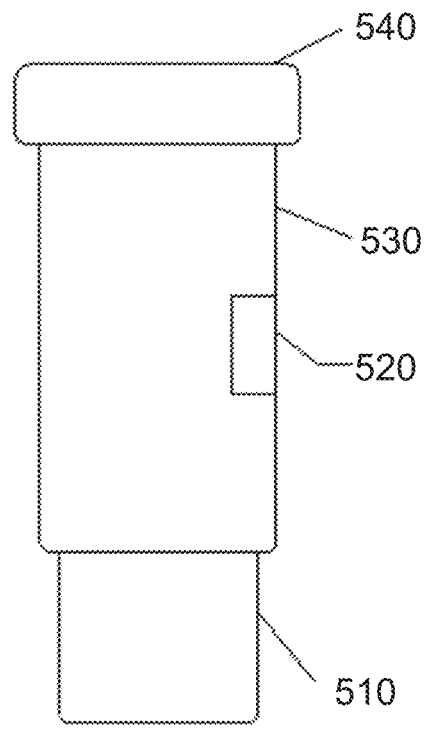
FIG. 5 is a schematic diagram illustrating an exemplary observation assembly according to some embodiments of the present disclosure.

In some embodiments, an observation assembly 218 may be mounted on the first through holes 410-1 and 410-2. Since the crystal growth period is relatively long, which may reach 5-40 days, an assembly through which the internal situation of the temperature field device 200 can be observed may be mounted on the temperature field device 200. A user (e.g., a worker in a factory) can observe the growth of the crystal through the observation assembly 218. If an abnormal situation is found, timely remedial action can be executed. FIG. 5 is a schematic diagram illustrating an exemplary observation assembly according to some embodiments of the present disclosure. The observation assembly 218 may be a tubular device with a closed end and an open end. The observation assembly 218 may include a first part 510. A size of the first part 510 may be matched with that of the first through hole 410-1/410-2 of the first cover plate 210, thereby realizing a connection between the observation assembly 218 and the first cover plate 210, for example, by a riveting connection, a screw connection, etc. Meanwhile, a lower end of the first part 510 may be open, accordingly, after the observation assembly 218 is connected with the first cover plate 210, a connection between an inner chamber of the observation assembly 218 and the first through hole 410-1/410-2 can be achieved. According to the diameter of the first through hole 410-1/410-2, a diameter of the first part 510 may be 15-30 mm, More preferably, the diameter of the first part 510 may be 18-27 mm. More preferably, the diameter of the first part 510 may be 20-25 mm. More preferably, the diameter of the first part 510 may be 21-24 mm, More preferably, the diameter of the first part 510 may be 22-23 mm. The observation assembly 218 may further include a second through hole 520. The second through hole 520 may be placed at any position of a second part 530 of the observation assembly 218 and may be connected with the inner chamber of the observation assembly 218. After the observation assembly 218 is connected to the first through hole 410-1/410-2, the second through hole 520 may be configured to realize the function of gas passing. In some embodiments, a diameter of the second through hole 520 may be 3-10 mm. More preferably, the diameter of the second through hole 520 may be 4-9 mm. More preferably, the diameter of the second through hole 520 may be 5-8 mm. More preferably, the diameter of the second through hole 520 may be 6-7 mm. The second part 530 may be a part that is protruded outside the first cover plate 210 after the observation assembly 218 is connected to the first through hole 410-1/410-2, and a height of the second part 530 may be 50-100 mm. More preferably, the height of the second part 530 may be 60-90 mm. Preferably, the height of the second part 530 may be 70-80 mm. More preferably, the height of the second part 530 may be 71-79 mm. More preferably, the height of the second part 530 may be 72-78 mm. More preferably, the height of the second part 530 may be 73-77 mm. More preferably, the height of the second part 530 may be 74-76 mm. In some embodiments, a diameter of the second part 530 may be 26-66 mm. More preferably, the diameter of the second part 530 may be 30-60 mm. More preferably, the diameter of the second part 530 may be 35-55 mm, More preferably, the diameter of the second part 530 may be 40-50 mm. More preferably, the diameter of the second part 530 may be 41-49 mm, More preferably, the diameter of the second part 530 may be 42-48 mm. More preferably, the diameter of the second part 530 may be 43-47 mm. More preferably, the diameter of the second part 530 may be 44-46 mm. The observation assembly 218 may further include an observation window 540. The observation window 540 may be mounted on a top of the observation assembly 218, and may be made of a transparent material such as quartz, polymethyl methacrylate (PMMA), polystyrene (PS), polycarbonate (PC), etc. The user (e.g., the worker in the factory) may observe an internal situation of the temperature field device 200 through the observation window 540.

Similarly, in order to reduce heat radiation emitted from the upper of the temperature field device 200, circulating cooling medium channel(s) may be mounted on the first cover plate 210. Refer back to FIG. 3, as shown in FIG. 3, the first cover plate 210 may include a cooling medium channel 420. A cooling manner may include liquid cooling, wind cooling, air cooling, or other manner that can achieve the cooling purpose. When the liquid cooling is used, a cooling medium may flow through the cooling medium channel 420. The cooling medium may include water, ethanol, ethylene glycol, isopropanol, n-hexane, or the like, or any combination thereof. For example, the cooling medium may include a 50:50 mixed liquid of water and ethanol. Through cooling medium inlets 430-1 and/or 430-2, the cooling medium may flow into the circulating cooling medium channels 440-1, 440-2, and 440-3 which are mounted inside the first cover plate 210. After absorbing heat dissipated from the temperature field device 110, the cooling medium may flow out through a cooling medium outlet 330-3. The flowed out cooling medium may return to the cooling medium channel 420 through other channels, and a next cycle may be performed. In some embodiments, diameters of the circulating cooling medium channels 440-1, 440-2, and 440-3 may be 5-25 mm. More preferably, the diameters of the circulating cooling medium channels 440-1, 440-2, and 440-3 may be 10-20 mm. More preferably, the diameters of the circulating cooling medium channels 440-1, 440-2, and 440-3 may be 11-19 mm. More preferably, the diameters of the circulating cooling medium channels 440-1, 440-2, and 440-3 may be 12-18 mm, More preferably, the diameters of the circulating cooling medium channels 440-1, 440-2, and 440-3 may be 13-17 mm. More preferably, the diameters of the circulating cooling medium channels 440-1, 440-2, and 440-3 may be 14-15 mm.

In some embodiments, the first cover plate 210 may further include a third through hole 450. For example, when the crystal growth is executed based on the Czochralski technique, a channel (e.g., the third through hole 450) for a pulling rod to enter into and/or exit from the temperature field device 200 may be mounted on the first cover plate 210. The third through hole 450 may mounted at a center of the first cover plate 210. A size of the third through hole 450 may be determined based on a size of the pulling rod. In some embodiments, a shape of the third through hole 450 may be various. The shape of the third through hole may include a regular shape such as a circle, a square, a rectangle, a diamond, a regular triangle, or any other irregular shape. In some embodiments, an area of the third through hole 450 may be 100-3000 mm$^2$. More preferably, the area of the third through hole 450 may be 200-2900 mm$^2$. More preferably, the area of the third through hole 450 may be 300-2800 mm$^2$. More preferably, the area of the third through hole 450 may be 400-2700 mm$^2$. More preferably, the area of the third through hole 450 may be 500-2600 mm$^2$. More preferably, the area of the third through hole 450 may be 600-2500 mm$^2$. More preferably, the area of the third through hole 450 may be 700-2400 mm$^2$. More preferably, the area of the third through hole 450 may be 800-2300 mm$^2$. More preferably, the area of the third through hole 450 may be 900-2200 mm$^2$. More preferably, the area of the third through hole 450 may be 1000-2100 mm$^2$. More preferably, the area of the third through hole 450 may be 1100-2000 mm$^2$. More preferably, the area of the third through hole 450 may be 1200-1900 mm$^2$. More preferably, the area of the third through hole 450 may be 1300-1800 mm$^2$. More preferably, the area of the third through hole 450 may be 1400-1700 mm$^2$. More preferably, the area of the third through hole 450 may be 1500-1600 mm$^2$. When the third through hole 450 is a circular through hole, its diameter may be 25-30 mm. More preferably, the diameter of the third through hole 450 may be 26-29 mm. More preferably, the diameter of the third through hole 450 may be 27-28 mm.

The second cover plate 212 may be mounted inside the first drum 204, cover the open end of the second drum 206 near the first cover plate 210, and be connected to the second drum 206 by a welding connection, a riveting connection, a bolt connection, a bonding connection, etc. In some embodiments, the second cover plate 212 may be made of a material with relatively good heat preservation performance to achieve heat preservation and heat insulation functions. The second cover plate 212 may include an alumina plate, a zirconia plate, a ceramic plate, a metal plate, etc., or a plate made of other heat resistant material such as boride, carbide, nitride, silicide, phosphide, sulfide, etc. of rare-earth metals. In some embodiments, a diameter of the second cover plate 212 may be determined based on the inner diameter of the first drum 204. The second cover plate 212 may fit the inner wall of the first drum 204. Since one end of the second drum 206 is completely covered, the filler 208 filled between the first drum 204 and the second drum 206 may be prevented from falling out and polluting the reactants in the crucible 214. In order to observe the internal situation of the temperature field device 200 from outside in existence of the second cover plate 212, through holes (also referred to as fourth through holes) corresponding to the through holes (e.g., the first through hole 410-1/410-2, the third through hole 450) on the first cover plate 210 may be opened on the second cover plate 212. The fourth through holes may have same rotation central axes as the first through holes and the third through hole. That is, the fourth through holes may be opened on the second cover plate 212 along the rotation central axes of the first and third through holes. In some embodiments, diameters of fourth through holes corresponding to the first through hole 410-1/410-2 may be 8-15 mm. More preferably, the diameters of fourth through holes corresponding to the first through hole 410-1/410-2 may be 9-14 mm. More preferably, the diameters of fourth through holes corresponding to the first through hole 410-1/410-2 may be 10-13 mm. More preferably, the diameters of fourth through holes corresponding to the first through hole 410-1/410-2 may be 11-12 mm. Angles between the rotation central axes of the fourth through holes corresponding to the first through hole 410-1/410-2 and a vertical line of the horizontal plane may be 3-20 degrees. More preferably, the angles between the rotation central axes of the fourth through holes corresponding to the first through hole 410-1/410-2 and the vertical line of the horizontal plane may be 5-18 degrees. More preferably, the angles between the rotation central axes of the fourth through holes corresponding to the first through hole 410-1/410-2 and the vertical line of the horizontal plane may be 7-15 degrees. More preferably, the angles between the rotation central axes of the fourth through holes corresponding to the first through hole 410-1/410-2 and the vertical line of the horizontal plane may be 9-13 degrees. More preferably, the angles between the rotation central axes of the fourth through holes corresponding to the first through hole 410-1/410-2 and the vertical line of the horizontal plane may be 11-12 degrees. A distance between centers of the fourth through holes corresponding to the first through hole 410-1/410-2 may be 50-140 mm. More preferably, the distance between centers of the fourth through holes corresponding to the first through hole 410-1/410-2 may be 60-130 mm. More preferably, the distance between centers of the fourth through holes corresponding to the first through hole 410-1/410-2 may be 70-120 mm. More preferably, the distance between centers of the fourth through holes corresponding to the first through hole 410-1/410-2 may be 80-110 mm. More preferably, the distance between centers of the fourth through holes corresponding to the first through hole 410-1/410-2 may be 90-100 mm. More preferably, the distance between centers of the fourth through holes corresponding to the first through hole 410-1/410-2 may be 91-99 mm. More preferably, the distance between centers of the fourth through holes corresponding to the first through hole 410-1/410-2 may be 92-98 mm. More preferably, the distance between centers of the fourth through holes corresponding to the first through hole 410-1/410-2 may be 93-97 mm. More preferably, the distance between centers of the fourth through holes corresponding to the first through hole 410-1/410-2 may be 94-96 mm. In some embodiments, a diameter of a fourth through hole corresponding to the third through hole may be 10-150 mm. More preferably, the diameter of the fourth through hole corresponding to the third through hole may be 20-140 mm. More preferably, the diameter of the fourth through hole corresponding to the third through hole may be 30-130 mm. More preferably, the diameter of the fourth through hole corresponding to the third through hole may be 40-120 mm. More preferably, the diameter of the fourth through hole corresponding to the third through hole may be 40-110 mm. More preferably, the diameter of the fourth through hole corresponding to the third through hole may be 60-100 mm. More preferably, the diameter of the fourth through hole corresponding to the third through hole may be 70-90 mm. More preferably, the diameter of the fourth through hole corresponding to the third through hole may be 75-85 mm. The diameter of the fourth through hole corresponding to the third through hole may affect the amount of heat dissipated through the fourth through hole, thereby affecting the temperature gradient of the temperature field device 200, Therefore, by changing the diameter of the fourth through hole corresponding to the third through hole, the temperature gradient of the temperature field device 200 can be adjusted.

Figure 6:
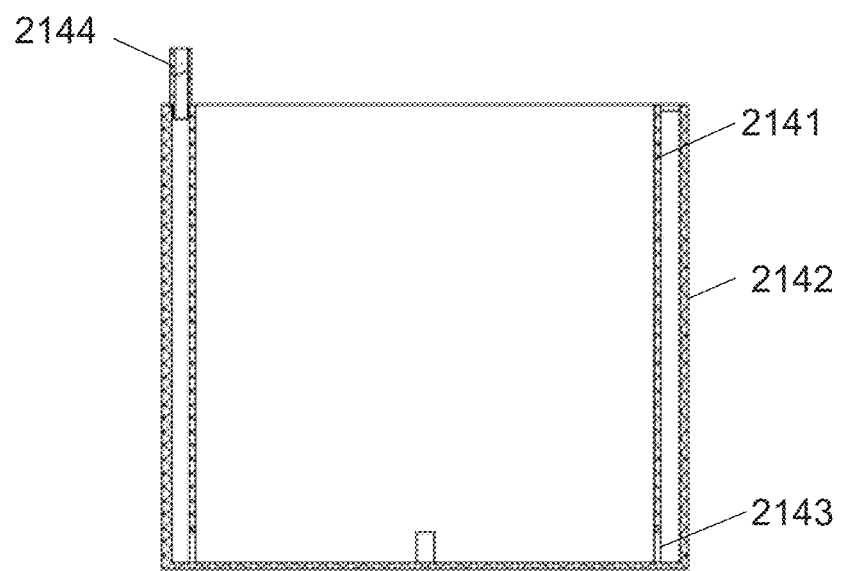
FIG. 6 is a schematic diagram illustrating a cross-sectional view of an exemplary crucible according to some embodiments of the present disclosure.
Figure 7:
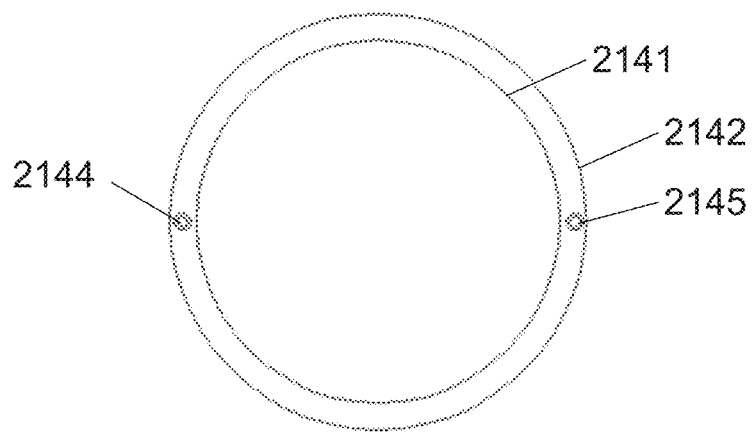
FIG. 7 is a schematic diagram illustrating a top view of an exemplary crucible according to some embodiments of the present disclosure.

FIG. 6 is a schematic diagram illustrating a cross-sectional view of an exemplary crucible according to some embodiments of the present disclosure, FIG. 7 is a schematic diagram illustrating a top view of an exemplary crucible according to some embodiments of the present disclosure. As shown in FIG. 6 and FIG. 7 the crucible 214 may be composed of two or more crucibles of different materials. As an example, FIG. 6 is a schematic diagram of a double-layer crucible. The crucible 214 may be composed of an inner crucible 2141 and an outer crucible 2142. For example, an outer surface of the outer crucible 2142 may be coated and then the inner crucible 2141 may be sheathed in the outer crucible 2142 to form the crucible 214. In some embodiments, an inner diameter and a height of the inner crucible 2141 and/or the outer crucible 2142 may be arbitrary. A thickness of the inner crucible 2141 and/or the outer crucible 2142 may be 1-20 mm. The inner crucible 2141 and/or the outer crucible 2142 may be made of a conductor such as iridium (Ir), molybdenum (Mo), tungsten (W), rhenium (Re), graphite (C), or tungsten molybdenum alloy, etc. In some embodiments, an outer diameter of the inner crucible 2141 may be smaller than an inner diameter of the outer crucible 2142 to facilitate the inner crucible 2141 to be nested in the outer crucible 2142. The inner crucible 2141 and the outer crucible 2142 may be tightly attached to each other, or a gap may be formed between the inner crucible 2141 and the outer crucible 2142. When the gap is formed between the inner crucible 2141 and the outer crucible 2142, upper edges of the inner crucible 2141 and the outer crucible 2142 may be flush, and the gap may be sealed to form an integral upper edge of the crucible. In this case, the crucible 214 may include a feeding port 2144. The feeding port 2144 may be connected to a feeding pipe of a feeding component and configured to receive reactant supplements. The reactant supplements may pass through the feeding port 2144 and then fall into the bottom of the crucible 214 through the gap between the inner crucible 2141 and the outer crucible 2142. Meanwhile, the inner crucible 2141 may include a plurality of through holes 2143 to allow the reactant supplements to enter. In addition, in order to prevent excessive pressure in the gap between the inner crucible 2141 and the outer crucible 2142, an exhaust port 2145 may be provided. On one hand, the exhaust port 2145 may make the feeding more smooth. If the gap is a sealed space, a volume of reactant supplements added is the same as that of gas needed to be discharged from the gap. Without the exhaust port 2145, the gas would be exhausted from the feeding port 2144, which is not conducive to feeding. On the other hand, the exhaust port 2145 may be provided at a position opposite to the feeding port 2144 on the crucible 214, which may make the formed temperature field more symmetrical after the crucible 214 is placed in the crystal growth device. In addition, the gas flow caused by the feeding may adjust the temperature gradient of the melt when the gas flows over the surface of the melt. Accordingly, the contact between oxygen and the surface of the crucible 214 can be isolated or reduced by using a crucible composed of crucibles of different materials, accordingly, the oxidation of the crucible 214 and the influence of oxides on the crystal can be avoided or reduced under a high-temperature and oxygen-rich environment. Meanwhile, the gap formed between the inner crucible 2141 and the outer crucible 2142 may form a reactant melting zone. The added reactant supplements may be melted in the gap. In some embodiments, a coating operation may be performed on the different crucibles. The coating operation may refer to an operation in which a high-temperature coating material (e.g., polyamide silicone) is added to the inner surface and/or the outer surface of the inner crucible 2141 and/or the outer crucible 2142. The contact of oxygen with the surface of the crucible 214 can be isolated or reduced by performing the coating operation on the crucible 214. When the gap is formed between the two crucibles to form the feed port 2144, the coating operation may be only performed on the outer surface of an outer crucible (i.e., the outer crucible 2142). When the two crucibles are tightly attached to each other and the reactant supplements are added to the inner crucible 2141 through the feeding pipe of the feeding component, the coating operation may be performed both on the outer surface of the inner crucible 2141 and the inner and outer surfaces of the outer crucible 2142, The crucible 214 may be a single-layer crucible and the coating operation may be only performed on the outer surface of the crucible 214.

In some embodiments, the crystal growth device may further include a feeding component. The feeding component may include a weighing assembly, a transfer assembly, and a control assembly. The weighing assembly may be configured to weigh the reactant supplements based on a supplement weight of the reactant supplements determined by the control assembly. The transfer assembly may be configured to transfer the reactant supplements weighed by the weighing assembly to the crucible. The control assembly may be configured to obtain a weight of the crystal being grown and determine the supplement weight of the reactant supplements at least based on the weight of the crystal being grown and a ratio among reactants for growing the crystal. The control assembly may further be configured to obtain a weight of the reactant supplements weighed by the weighing assembly in real-time and control the transfer assembly to transfer the reactant supplements from the weighing assembly to the crucible when the weight of the reactant supplements weighed by the weighing assembly is equal to the supplement weight of the reactant supplements. In some embodiments, the feeding component may further include a holding assembly. The holding assembly may be configured to hold the reactant supplements. When the weight of the reactant supplements weighed by the weighing assembly is less than the supplement weight of the reactants, the control assembly may control the holding assembly to transfer the reactant supplements to the weighing assembly. When the weight of the reactant supplements weighed by the weighing assembly is equal to the supplement weight of the reactant supplements, the control assembly may control the holding assembly to stop transferring the reactant supplements to the weighing assembly.

Figure 8:
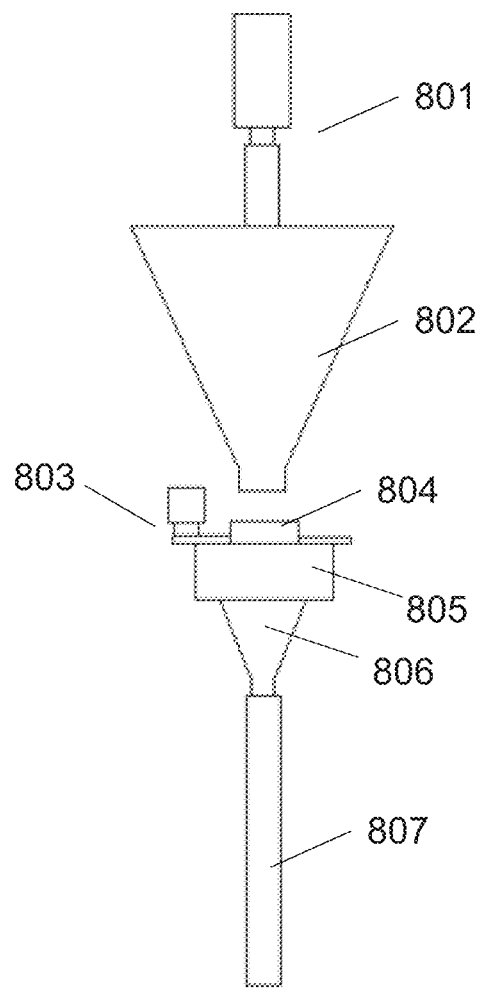
FIG. 8 is a schematic diagram illustrating an exemplary feeding component according to some embodiments of the present disclosure.

FIG. 8 is a schematic diagram illustrating an exemplary feeding component according to some embodiments of the present disclosure. The components (e.g., 801-807) of the feeding component 800 may constitute the weighing assembly, the transfer assembly, or the holding assembly individually or in combination. The control assembly (not shown) may be connected to the weighing assembly, the transfer assembly, and the holding assembly via an electrical connection or a network connection. As shown in FIG. 8, a component 801 and a component 802 may constitute the holding assembly. The component 802 may be a container in which the reactant supplements may be placed. The component 801 may be a drive motor and a transmission structure (e.g., a screw) thereof. A bottom of the component 802 may be through and a through port thereof may be sealed by a screw. When the drive motor drives the screw to move, the screw may temporarily open the through port, and the reactant supplements may fall through the through port. A component 804 and a component 805 may constitute the weighing assembly. The component 804 may be a container for receiving the reactant supplements dropped from the component 802. The component 805 may be a device with a weighing function. Meanwhile, the component 805 may also transmit the weight of the reactant supplements obtained by the component 805 to the control assembly in real-time. The component 804 may be placed on the component 805 and weighed by the component 805. A component 803, a component 806, and a component 807 may constitute the transfer assembly. The component 803 may be a drive motor and a transmission structure (e.g., a manipulator) thereof. When the component 803 is activated, the drive motor may drive a manipulator to grab the component 804 and pour the reactant supplements placed in the component 804 into the component 806 to complete the transfer of the reactant supplements. The component 806 and the component 807 may be a transfer structure. For example, the component 806 may be a feeding funnel and the component 807 may be a feeding tube. After the reactant supplements enter the component 806, the reactant supplements may be transferred to the crucible 214 through the component 807. For example, the component 807 may be in communication with the feeding port 2144 of the crucible 214. The control assembly may include a computer central processing unit (CPU) controlling-computing system and/or a programmable logic controller (PLC). During the process for adding the reactant supplements, when the weight of the reactant supplements obtained by the component 805 is less than the supplement weight of the reactant supplements, the control assembly may control the component 801 to start the drive motor to drive the screw to move, and transfer the reactant supplements from the container 802 to the component 804. When the weight of the reactant supplements obtained by the component 805 is equal to the supplement weight of the reactant supplements, the control assembly may control the component 801 to reset, that is, control the screw to recluse the through port in the bottom of the component 802. Meanwhile, the transferring of the reactant supplements to component 804 is stopped. At the same time, the control assembly may control the component 803 to be activated, and then the component 803 may transfer the reactant supplements from the component 804 to the crucible 214 through the component 806 and the component 807.

In some embodiments, the other end of the component 807 may pass through the observation assembly 218 and the first through hole 410-1/410-2 in sequence, and be placed on the inner wall of the edge of the crucible 214 or connected to the feeding port 2144. In some embodiments, the other end of the component 807 may pass through the observation assembly 218, the first through hole 410-1/410-2, and the heater 226 in sequence, and be placed on the inner wall of the edge of the crucible 214 or connected to the feeding port 2144. In some embodiments, the other end of the component 807 may pass through the observation assembly 218, the first through hole 410-1/410-2, and the fourth through hole corresponding to the first through hole 410-1/410-2 in sequence, and be placed on the inner wall of the edge of the crucible 214 or connected to the feeding port 2144. In some embodiments, the other end of the component 807 may pass through the observation assembly 218, the first through hole 410-1/410-2, the fourth through hole corresponding to the first through hole 410-1/410-2, and the heater 226 in sequence, and be placed on the inner wall of the edge of the crucible 214 or connected to the feeding port 2144.

In some embodiments, a thickness of the second cover plate 212 may be 20-35 mm. More preferably, the thickness of the second cover plate 212 may be 25-30 mm. More preferably, the thickness of the second cover plate 212 may be 26-29 mm. More preferably, the thickness of the second cover plate 212 may be 27-28 mm. In some embodiments, a position of the second cover plate 212 in the temperature field device 200 may be determined based on the length and the mounting position of the second drum 206. When the length of the second drum 206 is greater than a length threshold, the second cover plate 212 may be close to the first cover plate 210. A certain distance may be maintained between the second cover plate 212 and the first cover plate 210.

The sealing ring 220 and the pressure ring 222 may achieve a seal between the first drum 204 and the first cover plate 210. In some embodiments, the sealing ring 220 may be mounted at the joint between the first drum 204 and the first cover plate 210. The sealing ring 220 may be made of a material having a certain elasticity, for example, silicone or rubber. An inner diameter of the sealing ring 220 may be less than or equal to the outer diameter of the first drum 114, so that when the sealing ring 220 is mounted, the sealing ring 220 may be stretched to seal effectively the space between the first drum 204 and the first cover plate 210. In some embodiments, the inner diameter of the sealing ring 220 may be 170-440 mm. More preferably, the inner diameter of the sealing ring 220 may be 200-410 mm. More preferably, the inner diameter of the sealing ring 220 may be 250-350 mm. More preferably, the inner diameter of the sealing ring 220 may be 260-340 mm. More preferably, the inner diameter of the sealing ring 220 may be 270-330 mm. More preferably, the inner diameter of the sealing ring 220 may be 280-320 mm. More preferably, the inner diameter of the sealing ring 220 may be 290-310 mm. A wire diameter of the sealing ring 220 may be 5-10 mm. More preferably, the wire diameter of the sealing ring 220 may be 6-9 mm. More preferably, the wire diameter of the sealing ring 220 may be 7-8 mm.

The pressure ring 222 may be configured to perform a fixing and compressing function for the sealing ring 220. In some embodiments, a shape of the pressure ring 222 may be matched with that of the first drum 204, and an inner diameter of the pressure ring 222 may be greater than the outer diameter of the first drum 204. In this case, the pressure ring 222 may be nested on the first drum 204 and may be movable. The pressure ring 222 may include a threaded hole corresponding to the first cover plate 210. When the pressure ring 222 is being mounted, the sealing ring 220 may be mounted between the pressure ring 222 and the first cover plate 210. The pressure ring 222 may be connected to the first cover plate 210 by threads, thereby compressing the sealing ring 220, enlarging a contact surface of the sealing ring 220 with the space between the first drum 204 and the first cover plate 210, causing the contact tight, and achieving the purpose of effective sealing. In some embodiments, other items (e.g., a vacuum grease) may be used to achieve the sealing. When the sealing ring 220 is being mounted, the sealing ring 220 may be covered with the vacuum grease to achieve more effective sealing. In some embodiments, the pressure ring 222 and the first cover plate 110 may also be connected by a buckle connection. In some embodiments, an outer diameter of the pressure ring 222 may be 200-500 mm. More preferably, the outer diameter of the pressure ring 222 may be 250-450 mm. More preferably, the outer diameter of the pressing ring 222 may be 300-400 mm. More preferably, the outer diameter of the pressing ring 222 may be 310-390 mm. More preferably, the outer diameter of the pressing ring 222 may be 320-380 mm. More preferably, the outer diameter of the pressing ring 222 may be 330-370 mm. More preferably, the outer diameter of the pressure ring 222 may be 340-360 mm. More preferably, the outer diameter of the pressing ring 222 may be 345-355 mm. An inner diameter of the pressure ring 222 may be 190-460 mm. More preferably, the inner diameter of the pressure ring 222 may be 220-430 mm. More preferably, the inner diameter of the pressing ring 222 may be 250-400 mm. Preferably, the inner diameter of the pressure ring 222 may be 280-420 mm. More preferably, the inner diameter of the pressing ring 222 may be 300-400 mm. Preferably, the inner diameter of the pressure ring 222 may be 310-390 mm. More preferably, the inner diameter of the pressing ring 222 may be 310-390 mm. Preferably, the inner diameter of the pressing ring 222 may be 320-380 mm. More preferably, the inner diameter of the pressure ring 222 may be 330-370 mm. Preferably, the inner diameter of the pressure ring 222 may be 440-360 mm. More preferably, the inner diameter of the pressure ring 222 may be 345-355 mm. A thickness of the pressing ring 222 may be 8-15 mm. More preferably, the thickness of the pressing ring 222 may be 10-13 mm. More preferably, the thickness of the pressing ring 222 may be 11-12 mm.

In some embodiments, the temperature field device 200 may further include a gas channel 224. The gas channel 224 may be provided on the observation assembly 218, and a size of the gas channel 224 may be matched with the second through hole 520 to form a through pipe protruding from the observation assembly 218. In this case, a gas inlet pipe and/or a gas outlet pipe may be conveniently connected to the gas channel 224 to fill air into the temperature field device 200.

In some embodiments, the temperature field device 200 may be applied in crystal growth. After being weighed and performed a pretreatment (e.g., high-temperature roasting, room temperature mixing, isostatic pressing) according to a reaction equation, the reactants for growing crystals may be placed in the crucible 214 for reaction. Different crystals may require different growth conditions, for example, different temperature gradients. Accordingly, the temperature gradient may be adjusted by changing an amount and a tightness of the filler 208 filled in the temperature field device 200 (e.g., the filler 208 filled in the second drum 206). For example, the amount of the filler 208 may determine the relative position of the crucible 214 and the induction coil 216, and further determine a heating center of the temperature field. Meanwhile, the higher the tightness of the filler 208 is, the better the heat insulation capacity and the stability of the formed temperature field may be, and the more beneficial for crystal growth may be. After the amount and the tightness of the filler 208 are determined, other components may be mounted and sealed. After all the components are mounted, a gas may be filled into the temperature field device 200, and an auxiliary component (e.g., a cooling circulation pump) may be activated to introduce a cooling medium to the circulating cooling medium channel(s) in the bottom plate 202 and the first cover plate 210. Then, the crystal growth device (including the temperature field device 200) may be activated to start the crystal growth. The gas filled into the temperature field device 200 may enter through one or more first through holes (e.g., one or more gas channels 224). The gas exiting from the temperature field device 200 may be exhausted through the remaining first through holes (e.g., one or more gas channels 224), the first through hole(s) through which the gas is filled, or the third through hole. Through processes such as a seed crystal preheating process, a seeding process, a necking process, a shouldering process, a constant diameter growth process, an ending process, a cooling process, a crystal removing process, the crystal growth process may be finalized, etc.

Figure 9:
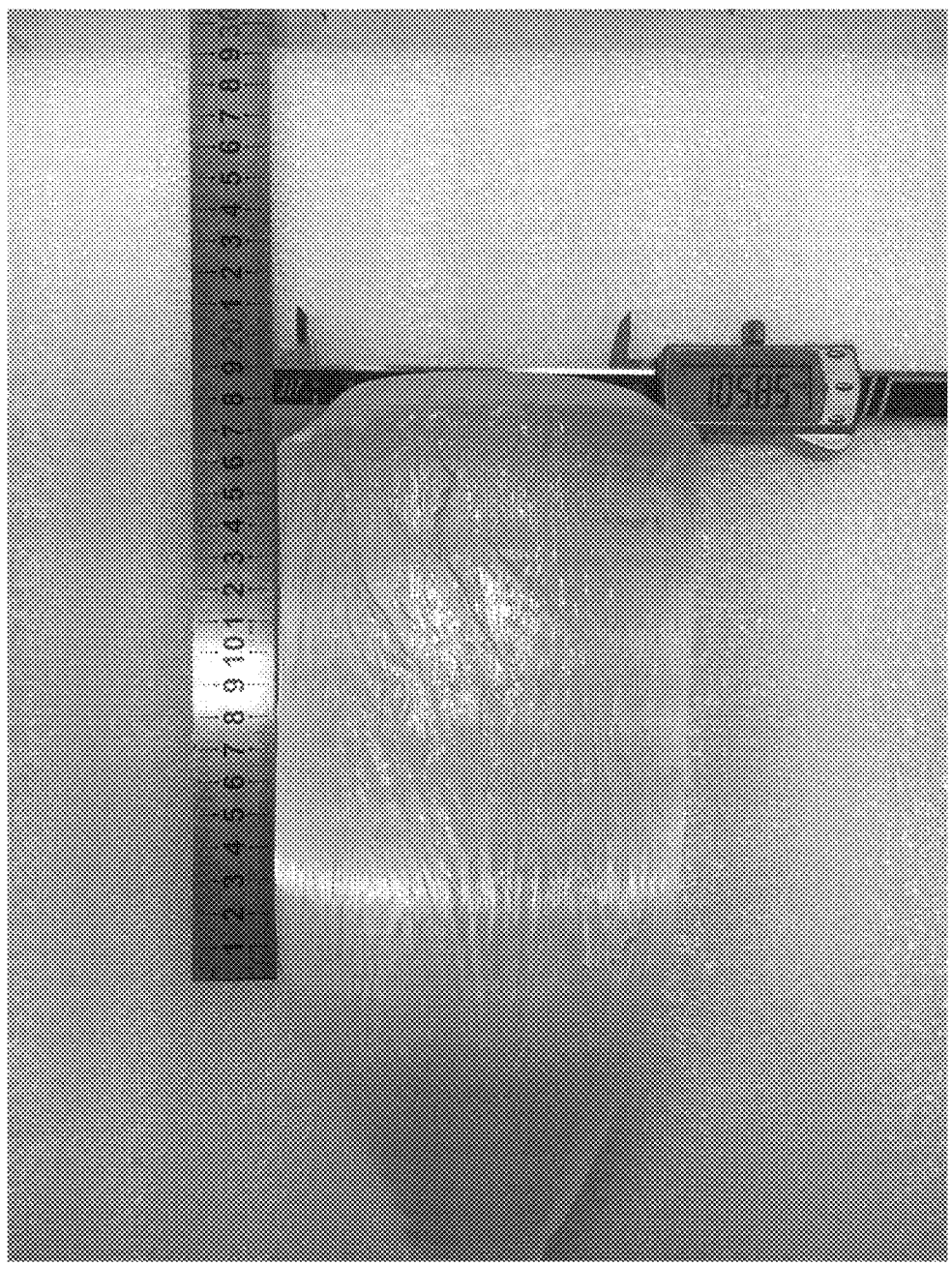
FIG. 9 is a schematic diagram illustrating an exemplary image of a grown crystal according to some embodiments of the present disclosure.
Figure 10:
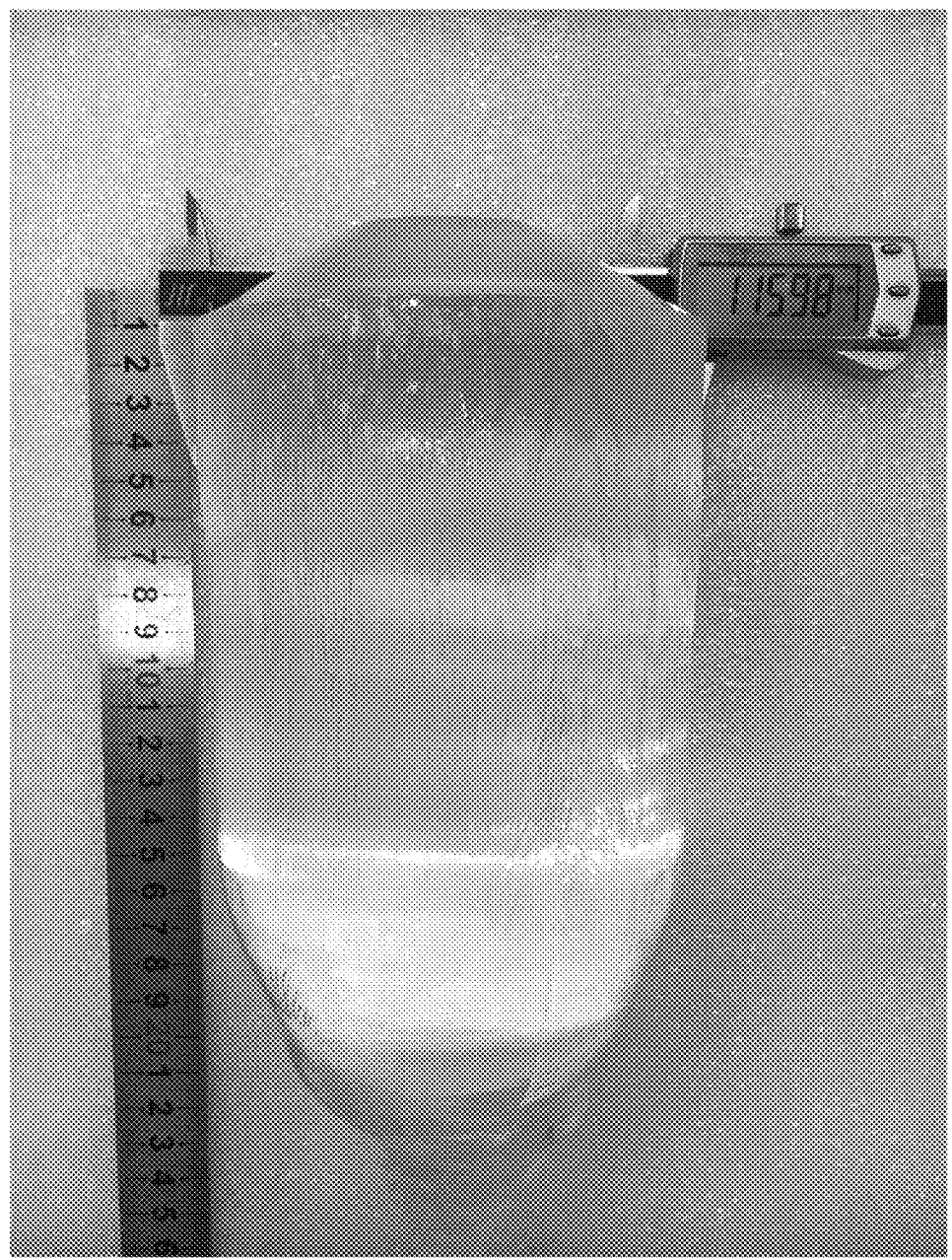
FIG. 10 is a schematic diagram illustrating an exemplary image of another grown crystal according to some embodiments of the present disclosure.

FIG. 9 is a schematic diagram illustrating an exemplary image of a grown crystal according to some embodiments of the present disclosure. FIG. 10 is a schematic diagram illustrating an exemplary image of another grown crystal according to some embodiments of the present disclosure. As shown in FIG. 9, the grown crystal is an LSO crystal, a length of the grown oxide crystal is 17 cm, and a diameter of the grown oxide crystal is 105 mm. As shown in FIG. 10, the grown crystal is an LYSO crystal, a length of the grown oxide crystal is 17 cm, and a diameter of the grown oxide crystal is 115 mm. The two crystals have complete appearance, no cracks, no clouds, no misalignment, no structural defects, a large size, and good uniformity.

According to the devices and the methods for crystal growth disclosed in the present disclosure, the supplements of excess reactants are used and a flowing gas is introduced, which can reduce composition deviation caused by volatility of the reactants during the growth process and improve the crystal performance consistency and growth repeatability. Further, an improved temperature field device can provide a temperature field with good temperature gradient and good uniformity for the growth of the crystal, which may reduce crack of the crystal. In addition, a heater is added to the temperature field device to provide the crystal with a temperature required for annealing, and an oxygen-rich flowing gas is introduced to reduce oxygen vacancy during the crystal growth. An assembly preprocessing operation is performed on the crystal growth device to prevent the oxidation of the device caused by an oxygen-rich environment. By optimizing the parameters of the crystal growth, the crystal performance consistency is improved. In addition, a real-time automatic feeding process is performed during the crystal growth, a liquid level position of the melt in the crucible is kept constant (i.e., a concentration of the melt is kept unchanged) during the crystal growth, which may achieve high uniform crystal growth, that is, the grown crystal has high uniformity from top to bottom. A crystal with a larger size can be grown using a small crucible, which can reduce time and production costs, increase profit margins, maximize the use of resources, and increase the utilization rate of the crystal.

It should be noted that different embodiments may have different beneficial effects. In different embodiments, the possible beneficial effects may have one or more above described beneficial effects, or any other beneficial effects.

EXAMPLE

The present disclosure may be further described according to the following embodiments.

Example 1

The Installation of Temperature Field Device 200

In step 1, the bottom plate 202 may be mounted on an aluminum plate of a crystal growth device. A level of the bottom plate 202 may be adjusted to 0.02 mm/m.

In step 2, the second drum 206 may be mounted on the bottom plate 202, and a concentricity and a verticality between the second drum 206 and the bottom plate 202 may be adjusted. The concentricity between the second drum 206 and the bottom plate 202 may be less than 0.5 mm. The perpendicularity between the second drum 206 and the bottom plate 202 may be less than 0.2 degrees.

In step 3, the first drum 204 may be mounted on the bottom plate 202, and a concentricity and a verticality between the first drum 204 and the bottom plate 202 may be adjusted. The concentricity between the first drum 204 and the bottom plate 202 may be less than 0.5 mm. The perpendicularity between the first drum 204 and the bottom plate 202 may be less than 0.2 degrees. A high-temperature adhesive may be used to seal a joint between the first drum 204 and the bottom plate 202, thereby ensuring a positive pressure and avoiding gas leakage.

In step 4, the filler 208 may be filled to the space between the first drum 204 and the second drum 206, and filled in the bottom of the second drum 206. An amount and a tightness of the filler 208 may be determined according to a growth condition of the crystal.

In step 5, the crucible 214 may be placed on the filler 208 filled on the bottom of the second drum 206. A vertical distance between an upper edge of the crucible 214 and an upper edge of the induction coil 216 may be −20 mm to 6 mm. "−" represents that the upper edge of crucible 214 is below the upper edge of induction coil 216, "0" represents that the upper edge of crucible 214 is flush with the upper edge of induction coil 216, "+" represents that the upper edge of the crucible 214 is higher than the upper edge of the induction coil 216. The vertical distance between the upper edge of the crucible 214 and the upper edge of the induction coil 216 may be changed according to the growth condition of the crystal to be grown.

In step 6, the heater 226 may be mounted above the crucible 214.

In step 7, the second cover plate 212 may be mounted above the second drum 206. A concentricity among the second cover plate 212, the first drum 204, and the second drum 206 may be adjusted.

In step 8, the pressure ring 222 and the sealing ring 220 coated with vacuum grease may be mounted.

In step 9, the first cover plate 210 may be mounted above the first drum 204. A concentricity between the first cover plate 210 and the first drum 204 may be adjusted to ensure that the first through hole (e.g., the first through hole 410-1/410-2) on the first cover plate 210 may have the same axis(es) with the fourth through hole(s) corresponding to the second cover plate 212. The pressure ring 222 and the first cover plate 210 may be connected via a thread connection and the sealing ring 220 may be pressed to achieve sealing function, ensure a positive pressure, and avoid gas leakage.

In step 10, the observation assembly 218 may be mounted on the first cover plate 210 and a vent pipe may be connected to the gas channel 224.

In step 11, the feeding pipe 807 may be mounted. One end of the feeding pipe 807 may pass through the observation assembly 218, the first through hole (e.g., the first through hole 410-1/410-2) on the first cover plate 210, the fourth through hole(s) on the second cover plate 212, and the heater 226 in sequence, and be connected to the feeding port 2144 of the crucible 214. The other end of the feeding pipe 807 may be connected to the feeding component.

Example 2

Ce:LSO Crystal Growth

The crystal may be prepared using the Czochralski technique via a medium frequency induction heating mode and a single crystal growth induction furnace with an open furnace. A temperature field device may be mounted according to the steps 1-5 described in Example 1. Reactants with purity of 99.999% may be taken out after a roasting process is performed on the reactants at 1000° C. for 5 hours and the reactants are naturally cooled to room temperature 35° C. The reactants may be weighted based on a molar ratio of the reactants according to a reaction equation below:

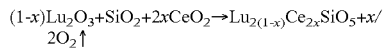
$$(1-x)Lu_2O_3+SiO_2+2xCeO_2 \rightarrow Lu_{2(1-x)}Ce_{2x}SiO_5+x/2O_2\uparrow$$

Wherein x=0.16%, a weight of $SiO_2$ may exceed 0.2% of a theoretical weight value of $SiO_2$ calculated according to the reaction equation, and other reactants may be weighed according to a stoichiometric ratio in the reaction equation. A total weight of the reactants in the crucible 214 is 10000 grams, and the weights of $Lu_2O_3$, $SiO_2$, and $CeO_2$ are 8674 grams, 1314 grams, and 12 grams, respectively. After being weighted, the reactants may be placed in a three-dimensional mixer for 0.5-48 hours, and then be taken out and placed in a pressing mold and pressed into a cylindrical shape by a cold isostatic pressing device with a pressure of 100-300 MPa. The reactants may be placed in an iridium crucible with a diameter of 120 mm and a height of 120 mm. The iridium crucible may be placed in the mounted temperature field device. A concentricity between the iridium crucible and the temperature field device may be adjusted and a crucible position of the iridium crucible may be set as +20 mm. A concentricity among the iridium crucible 214, the heater 226, the second cover plate 212, the first cover plate 210, and the weighing guide rod may be successively adjusted. The seal of the first cover plate 210 and the first drum 204 may be ensured. After the observation assembly 218 is mounted on the first cover plate 210, a flowing gas of mixed $N_2$ and $O_2$ may be introduced into the temperature field device with a gas flow rate of 30 L/min and a circulating cooling liquid may be introduced into the temperature field device. A volume ratio of oxygen in the flowing gas may be 10%. Parameters of the crystal growth may be set. For example, a diameter of the crystal may be set as 105 mm, a shoulder length may be set as 100 mm, a constant diameter may be set as 150 mm, an ending length may be set as 50 mm, a heating time may be set as 24 hours, a rotation rate may be set as 10 revolutions per minute, a puffing rate may be set as 2 mm/hour, a cooling time may be set as 60 hours, a PID value may be set as 0.5, a crystal density may be set as 7.4 g/cm³, and a melt density may be set as 6.3 g/cm³. The automatic feeding may be set to be activated when the crystal grows to 1000 grams. After the parameters are set, a seed crystal of Ce:LSO may be placed on a top of the puffing rod, which may be connected to a weighing guide rod and a concentricity between the seed crystal and the first cover plate 210 may be adjusted. The temperature may be increased to melt the reactants. During rising temperature, the seed crystal may be slowly dropped for preheating. To avoid cracking of seed crystal, a distance between the seed crystal and a surface of the reactants may be kept as 5-15 mm. After the pulling rod is installed, the feeding pipe 807 may be put in from a right side of the observation assembly 218. One end of the feeding pipe 807 may pass through the observation assembly 218, the first through hole (e.g., the first through hole 410-1/410-2) on the first cover plate 210, the fourth through hole(s) on the second cover plate 212, and the heater 226 in sequence, and be connected to the feeding port 2144 of the crucible 214. The $Lu_2O_3$, $SiO_2$, and $CeO_2$ that have been roasted at 1000° C. for 5 hours may be placed in the container 802. A concentration of $CeO_2$ at a crystal tail may be calculated according to $C_1=C_0K(1-g)^{k-1}$, wherein an initial ingredient concentration $C_0$ may be 0.16% and K refers to a segregation coefficient. For example, K may be 0.22, g=(a weight of crystal)/(a total weight of the reactants)=0.1, accordingly, $C_1$=0.038%, and accordingly, a doping concentration x of the reactant supplements=a concentration of the crystal tail when the feeding is activated=0.038%. A weight ratio of the reactant supplements $Lu_2O_3$, $SiO_2$, and $CeO_2$ may be calculated according to the reaction equation below:

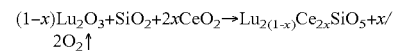
$$(1-x)Lu_2O_3+SiO_2+2xCeO_2 \rightarrow Lu_{2(1-x)}Ce_{2x}SiO_5+x/2O_2\uparrow$$

Wherein x=0.038% and a weight of $SiO_2$ may exceed 0.2% of a theoretical weight value of $SiO_2$ calculated according to the reaction equation. The calculated weight ratio of the reactant supplements $Lu_2O_3$, $SiO_2$, and $CeO_2$ may be $Lu_2O_3$:$SiO_2$:$CeO_2$ (wt %)=86.83:13.14:0.03. It is assumed that a total weight of the reactant supplements is 1000 grams, a weight of $Lu_2O_3$ is 868.3 grams, a weight of $SiO_2$ is 131.4 grams, and a weight of $CeO_2$ is 0.3 Grams. The above calculation process may be executed by the control assembly, After the reactants are melt, the seed crystal may be slowly dropped to contact with the melt and the temperature may be adjusted. During adjusting the temperature, the seed crystal may be sunk 2 mm to effectively contact with the melt, ensure interface integrity, and reduce crystal cracking caused by a seeding point during a subsequent cooling process. After the temperature is adjusted as suitable, an automatic control program may be started to enter an automatic growth mode. After a necking process, a shouldering process, a constant diameter growth process, an ending process, and a cooling process, the crystal growth may end after 14 days. During the cooling process, when the temperature drops to 1300 degrees, the volume ratio of oxygen in the flowing gas may be 25%. When the temperature drops to 800 degrees or below, the volume ratio of oxygen in the flowing gas may be 12% again.

A color of the crystal is white, a shape of the crystal is normal as a preset shape, a surface of the crystal is rough, and there is a slight melt back strip. After a head and a tail of the crystal are removed and the remaining portions are polished, an interior of the crystal is transparent. The crystal has no macro defects such as point scattering, a cloud layer, a wrapping material, etc. when the crystal is irradiated with x laser. Through a testing process, the lattice parameters of the crystal are a=1.4254 nanometers, b=0.6641 nanometers, c=1.0241 nanometers, and β=122 degrees 12 seconds. A transmittance of the crystal from ultraviolet, visible light, to near-infrared band is greater than 80%. A center wavelength of the crystal is 420 nanometers, a light yield is greater than or equal to 58000 photons/megaelectron volt, an energy resolution may be less than or equal to 6.5%, and a decay time is less than or equal to 30 nanoseconds.

Example 3

Ce:LYSO Crystal Growth

The crystal may be prepared using the Czochralski technique via a medium frequency induction heating mode and a single crystal growth induction furnace with an open furnace. The temperature field device may be mounted according to the steps 1-5 in Example 1, The reactant with purity of 99.999% may be taken out after a roasting process is performed on the reactants at 1200° C. for 5 hours and the reactants are naturally cooled to room temperature 35° C.

The reactants may be weighed based on a molar ratio of the reactants according to a reaction equation below:

$$(1-x-y)Lu_2O_3+yY_2O_3+SiO_2+2xCeO_2 \rightarrow Lu_{2(1-x-y)}Y_{2y}Ce_{2x}SiO_5+x/2O_2\uparrow \quad (2)$$

Wherein x=0.16%, y=20%, a weight of $SiO_2$ may exceed 2% of a theoretical weight value of $SiO_2$ calculated according to the reaction equation, and other reactants may be weighed according to a stoichiometric ratio in the reaction equation. A total weight of the reactants in the crucible 214 may be 10000 grams, and the weights of $Lu_2O_3$, $Y_2O_3$, $SiO_2$, and $CeO_2$ may be 7500 grams, 1066 grams, 1421 grams, and 13 grams, respectively. After being weighted, the reactants may be placed in a three-dimensional mixer for 1-6 hours, and then taken out and placed in a pressing mold and pressed into a cylindrical shape by a cold isostatic pressing device with a pressure of 200 MPa. The reactants may be placed in an iridium crucible with a diameter of 180 mm and a height of 180 mm. The iridium crucible may be placed in the installed temperature field device. A concentricity between the iridium crucible and the temperature field device may be adjusted. A crucible position of the iridium crucible may be +20 mm. A concentricity among the iridium crucible 214, the heater 226, the second cover plate 212, the first cover plate 210, and the weighing guide rod may be successively adjusted. The seal of the first cover plate 210 and the first drum 204 may be ensured. After the observation assembly 218 is mounted on the first cover plate 210, a flowing gas of mixed $N_2$ and $O_2$ may be introduced into the temperature field device with a gas flow rate of 30 L/min and a circulating cooling liquid may be introduced the temperature field device. A volume ratio of oxygen in the flowing gas may be 10%. Parameters of the crystal growth may be set. For example, a diameter of the crystal may be set as 115 mm, a shoulder length may be set as 100 mm, a constant diameter may be set as 150 mm, an ending length may be set as 55 mm, a heating time may be set as 24 hours, a rotation rate may be set as 10 revolutions per minute, a puffing rate may be set as 1.5 mm/hour, a cooling time may be set as 100 hours, a PID value may be set as 0.5, a crystal density may be set as 7.25 g/cm³, and a melt density may be set as 6.15 g/cm³. The automatic feeding may be set to be activated when the crystal grows to 1000 grams. After the parameters are set, a seed crystal of $SiO_2$ may be placed on a top of the pulling rod, which may be connected to a weighing guide rod and a concentricity between the seed crystal and the first cover plate 210 may be adjusted. The temperature may be increased to melt the reactants. During rising temperature, the seed crystal may be slowly dropped for preheating. To avoid cracking of seed crystal, a distance between the seed crystal and a surface of the reactants may be kept as 5-15 mm. After the pulling rod is installed, the feeding pipe 807 may be put in from a right side of the observation assembly 218. One end of the feeding pipe 807 may pass through the observation assembly 218, the first through hole (e.g., the first through hole 410-1/410-2) on the first cover plate 210, the fourth through hole(s) on the second cover plate 212, and the heater 226 in sequence, and be connected to the feeding port 2144 of the crucible 214. The $Lu_2O_3$, $Y_2O_3$, $SiO_2$, and $CeO_2$ that have been roasted at 1200° C. for 5 hours may be placed in the container 802. A concentration of $CeO_2$ at a crystal tail may be calculated according to $C_1=C_0K(1-g)^{k-1}$, wherein an initial ingredient concentration of the ingredient $C_0$ may be 0.16% and K refers to a segregation coefficient. For example, K may be 0.32, g=(a weight of crystal)/(a total weight of the reactants), accordingly, $C_1$=0.055%, and accordingly, a doping concentration x of the reactant supplements=a concentration of the crystal tail when the feeding is activated=0.055%. A concentration of $Y_2O_3$ at the crystal tail may be calculated according to $C_1=C_0$, and a doping concentration y of the reactant supplements=20%. A weight ratio of the reactant supplements $Lu_2O_3$, $Y_2O_3$, $SiO_2$, and $CeO_2$ may be calculated according to the reaction equation below:

$$(1-x-y)Lu_2O_3+yY_2O_3+SiO_2+2xCeO_2 \rightarrow Lu_{2(1-x-y)}Y_{2y}Ce_{2x}SiO_5+x/2O_2\uparrow.$$

Wherein x=0.055%, y=20%, and a weight of $SiO_2$ may exceed 2% a theoretical weight value of $SiO_2$ calculated according to the reaction equation. The calculated weight ratio of the reactant supplements $Lu_2O_3$, $Y_2O_3$, $SiO_2$, and $CeO_2$ may be $Lu_2O_3:Y_2O_3:SiO_2:CeO_2$ (wt %)=75.09:10.66:14.21:0.04. It is assumed that a total weight of the reactant supplements is 1000 grams, a weight of $Lu_2O_3$ is 750.9 grams, a weight of $Y_2O_3$ is 106.6 grams, a weight of $SiO_2$ is 142.1 grams, and a weight of $CeO_2$ is 0.4 Grams. The above calculation process may be executed by the control assembly. After the reactants are melt, the seed crystal may be slowly dropped to contact with the melt and the temperature may be adjusted. During adjusting the temperature, the seed crystal may be sunk 2 mm to effectively contact with the melt, ensure interface integrity, and reduce crystal cracking caused by a seeding point during a subsequent cooling process. After the temperature is adjusted as suitable, an automatic control program may be started to enter an automatic growth mode. After a necking process, a shouldering process, a constant diameter growth process, an ending process, and a cooling process, the crystal growth may end after 16 days. During the cooling process, when the temperature drops to 1300 degrees, the volume ratio of oxygen in the flowing gas may be 18%. When the temperature drops to 800 degrees or below, the volume ratio of oxygen in the flowing gas may be 8% again.

A color of the crystal is white, a shape of the crystal is normal as a preset shape, a surface of the crystal is rough, and there is a slight melt back strip. After a head and a tail of the crystal are removed and the remaining portions are polished, an interior of the crystal is transparent. The crystal has no macro defects such as point scattering, a cloud layer, a wrapping material, etc. when the crystal is irradiated with x laser. Through a testing process, the lattice parameters of the grown crystal are a=1.4254 nanometers, b=0.6641 nanometers, c=1.0241 nanometers, β=122.2 degrees. A transmittance of the crystal from ultraviolet, visible light, to near-infrared band is greater than 80%. A center wavelength of the crystal is 420 nanometers, a light yield is greater than or equal to 60000 photons/megaelectron volt, an energy resolution may be less than or equal to 6%, and a decay time is less than or equal to 35 nanoseconds.

Example 4

Yb:YAG Crystal Growth

The crystal may be prepared using the Czochralski technique via a medium frequency induction heating mode and a single crystal growth induction furnace with an open furnace. A temperature field device may be mounted according to steps 1-5 in Example 1, Reactants with purity of 99.999% may be taken out after a roasting process is performed on the reactants at 1000° C. for 5 hours and the reactants are naturally cooled to room temperature 35° C.

The reactants may be weighted based on a molar ratio of the reactants according to a reaction equation below:

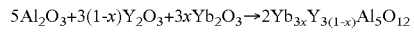

Wherein x=0.16% and other reactants may be weighed according to a stoichiometric ratio in the reaction equation. A total weight of the reactants in the crucible 214 is 10000 grams, and the weights of $Al_2O_3$, $Y_2O_3$, and $Yb_2O_3$ are 4119 grams, 4926 grams, and 955 grams, respectively. After being weighted, the reactants may be placed in a three-dimensional mixer for 0.5-48 hours, and then be taken out and placed in a pressing mold and pressed into a cylindrical shape by a cold isostatic pressing device with a pressure of 100-300 MPa. The reactants may be placed in an iridium crucible with a diameter of 120 mm and a height of 120 mm. The iridium crucible may be placed in the mounted temperature field device. A concentricity between the iridium crucible and the temperature field device may be adjusted and a crucible position of the iridium crucible may be set as +20 mm. A concentricity among the iridium crucible 214, the heater 226, the second cover plate 212, the first cover plate 210, and the weighing guide rod may be successively adjusted. The seal of the first cover plate 210 and the first drum 204 may be ensured. After the observation assembly 218 is mounted on the first cover plate 210, a flowing gas of mixed $N_2$ and $O_2$ may be introduced into the temperature field device with a gas flow rate of 30 L/min and a circulating cooling liquid may be introduced into the temperature field device. A volume ratio of oxygen in the flowing gas may be 10%. Parameters of the crystal growth may be set. For example, a diameter of the crystal may be set as 75 mm, a shoulder length may be set as 85 mm, a constant diameter may be set as 165 mm, an ending length may be set as 60 mm, a heating time may be set as 24 hours, a rotation rate may be set as 10 revolutions per minute, a pulling rate may be set as 2 mm/hour, a cooling time may be set as 60 hours, a PID value may be set as 0.5, a crystal density may be set as 4.56 g/cm$^3$, and a melt density may be set as 4 g/cm$^3$. The automatic feeding may be set to be activated when the crystal grows to 1000 grams. After the parameters are set, a seed crystal of Yb:YAG may be placed on a top of the pulling rod, which may be connected to the weighing guide rod and a concentricity between the seed crystal and the first cover plate 210 may be adjusted. The temperature may be increased to melt the reactants. During rising temperature, the seed crystal may be slowly dropped for preheating. To avoid cracking of seed crystal, a distance between the seed crystal and a surface of the reactants may be kept as 5-15 mm. After the pulling rod is installed, the feeding pipe 807 may be put in from a right side of the observation assembly 218. One end of the feeding pipe 807 may pass through the observation assembly 218, the first through hole (e.g., the first through hole 410-1/410-2) on the first cover plate 210, the fourth through hole(s) on the second cover plate 212, and the heater 226 in sequence, and be connected to the feeding port 2144 of the crucible 214. The $Al_2O_3$, $Y_2O_3$, and $Yb_2O_3$ that have been roasted at 1000° C. for 5 hours may be placed in the container 402. A concentration of $Yb_2O_3$ at a crystal tail may be calculated according to $C_1=C_0K(1-g)^{K-1}$, wherein an initial ingredient concentration of the ingredient $C_0$ may be 10% and K refers to a segregation coefficient. For example, K may be 1.1, g=(a weight of crystal)/(a total weight of the reactants), accordingly, $C_1$=10.8%, and accordingly, a doping concentration x of the reactant supplements=concentration of the crystal tail when the feeding is activated=10.8%. A weight ratio of the reactant supplements $Al_2O_3$, $Y_2O_3$, and $Yb_2O_3$ may be calculated according to the reaction equation below:

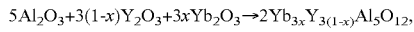

wherein x=10.8% and $Al_2O_3$, $Y_2O_3$, and $Yb_2O_3$ may be weighed according to a stoichiometric ratio in the reaction equation. The calculated weight ratio of the reactant supplements $Al_2O_3$, $Y_2O_3$, and $Yb_2O_3$ may be $Al_2O_3$:$Y_2O_3$:$Yb_2O_3$ (wt %)=41.06:48.66:10.28. It is assumed that a total weight of the reactant supplements is 1000 grams, a weight of $Al_2O_3$ may be 410.6 grams, a weight of $Y_2O_3$ may be 486.6 grams, and a weight of $Yb_2O_3$ may be 102.8 Grams. The above calculation process may be executed by the control assembly. After the reactants are melt, the seed crystal may be slowly dropped to contact with the melt and the temperature may be adjusted. During adjusting the temperature, the seed crystal may be sunk 2 mm to effectively contact with the melt, ensure interface integrity, and reduce crystal cracking caused by a seeding point during a subsequent cooling process. After the temperature is adjusted as suitable, an automatic control program may be started to enter an automatic growth mode. After a necking process, a shouldering process, a constant diameter growth process, an ending process, and a cooling process, the crystal growth may end after 14 days. During the cooling process, when the temperature drops to 1300 degrees, the volume ratio of oxygen in the flowing gas may be 15%. When the temperature drops to 800 degrees or below, the volume ratio of oxygen in the flowing gas may be 8% again.

A color of the crystal is white, a shape of the crystal is normal, and there is a slight melt back strip. The crystal has no macro defects such as point scattering, a cloud layer, a wrapping material, etc. when the crystal is irradiated with red light. A lattice constant Å is 12.01, a crystal structure is a cubic crystal system, a melting point is 1970 degrees, a density is 4.56 g/cm$^3$, a hardness is 8.5, a thermal conversion efficiency is less than 11%, a thermal conductivity is 1.4 w/cm/k, a loss parameter is 0.005 cm-1, a refractive index is 1.823, dn/dt is $9*10^{-5}$/° C., a laser emission wavelength is 1030 nm/1050 nm, a fluorescence lifetime is 102 ms, an emission cross section is $2.2*10^{-20}$ cm$^2$, and a pump wavelength is 940 nm/970 nm inGaAs LD.

It should be noted that the above description for the basic concepts is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. Moreover, certain terminology has been used to describe embodiments of the present disclosure. For example, the terms "one embodiment," "an embodiment, and/or embodiments" mean that a particular feature, structure, or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures, or characteristics may be combined as suitable in one or more embodiments of the present disclosure.

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities, properties, and so forth, used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A crystal growth device, comprising a temperature field device and a feeding component configured to feed reactant supplements into a crucible, wherein
   the crucible includes an inner crucible and an outer crucible, the inner crucible and the outer crucible including a sealed gap where a feed port used to receive reactant supplements and an exhaust port used to exhaust gas are provided;
   the temperature field device includes a bottom plate, a cover plate, a first drum, a second drum, and a filler, wherein
      the bottom plate is mounted on a bottom of the temperature field device and covers an open end of the first drum,
      the cover plate is mounted on a top of the temperature field device and covers the other open end of the first drum,
      the second drum is mounted inside the first drum, and
      the filler is filled in the second drum and/or a space between the second drum and the first drum.

2. The crystal growth device of claim 1, wherein the gap between the inner crucible and the outer crucible forms a reactant melting zone.

3. The crystal growth device of claim 1, wherein a bottom of an outer side of the inner crucible includes a plurality of openable and closable through holes for feeding the received reactant supplements into the inner crucible.

4. The crystal growth device of claim 1, wherein the temperature field device further includes a heater, the heater being mounted above the crucible.

5. The crystal growth device of claim 4, wherein
   the heater is made of at least one of iridium, platinum, molybdenum, tungsten, graphite, or a high-temperature-resistant material with a high melting point which can be heated by electromagnetic induction;
   an inner diameter of the heater is 40-240 mm; and
   a height of the heater is 2-200 mm.

6. The crystal growth device of claim 1, wherein the feeding component includes a weighing assembly, a transfer assembly, and a control assembly, wherein
   the weighing assembly is configured to weigh the reactant supplements based on a supplement weight of the reactant supplements determined by the control assembly;
   the transfer assembly is configured to transfer the reactant supplements weighed by the weighing assembly to the crucible; and
   the control assembly is configured to:
      obtain a weight of a crystal being grown;
      determine the supplement weight of the reactant supplements at least based on the weight of the crystal being grown and a ratio among reactants for growing the crystal;
      obtain a weight of the reactant supplements weighed by the weighing assembly in real-time; and
      control the transfer assembly to transfer the reactant supplements from the weighing assembly to the crucible when the weight of the reactant supplements weighed by the weighing assembly is equal to the supplement weight of the reactant supplements.

7. The crystal growth device of claim 6, wherein
   the feeding component further includes a holding assembly configured to hold the reactant supplements, and the control assembly is further configured to:
- control the holding assembly to transfer the reactant supplements to the weighing assembly when the weight of the reactant supplements weighed by the weighing assembly is less than the supplement weight of the reactant supplements; and
- control the holding assembly to stop transferring the reactant supplements to the weighing assembly when the weight of the reactant supplements weighed by the weighing assembly is equal to the supplement weight of the reactant supplements.

8. The crystal growth device of claim 1, wherein the exhaust port is located at an opposite position of the feed port.

9. The crystal growth device of claim 1, wherein the filler includes a granular shape filler.

10. The crystal growth device of claim 1, wherein the filler includes a felt shape filler.

11. The crystal growth device of claim 1, wherein the filler includes at least one of a zircon sand, a zirconia particle, or an alumina particle.

12. The crystal growth device of claim 1, wherein a particle size of the filler is 5-200 mesh.

13. The crystal growth device of claim 1, wherein the crystal growth device further includes a furnace, wherein
- the furnace is open; and
- the temperature field device is sealed.

* * * * *